(12) United States Patent
Motz et al.

(10) Patent No.: US 8,981,504 B2
(45) Date of Patent: Mar. 17, 2015

(54) VERTICAL HALL SENSOR WITH SERIES-CONNECTED HALL EFFECT REGIONS

(75) Inventors: Mario Motz, Villach (AT); Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 250 days.

(21) Appl. No.: 13/530,235

(22) Filed: Jun. 22, 2012

(65) Prior Publication Data

US 2013/0342194 A1  Dec. 26, 2013

(51) Int. Cl.
| | |
|---|---|
| H01L 29/82 | (2006.01) |
| G01R 33/06 | (2006.01) |
| G01R 33/07 | (2006.01) |
| H01L 27/22 | (2006.01) |
| H01L 43/06 | (2006.01) |

(52) U.S. Cl.
CPC .............. *G01R 33/07* (2013.01); *G01R 33/066* (2013.01); *H01L 27/22* (2013.01); *H01L 43/065* (2013.01)
USPC ......................................... 257/421; 257/414

(58) Field of Classification Search
CPC ....... H01L 43/065; H01L 43/14; H01L 43/04; G01R 33/77; G01R 33/75
USPC .......... 327/251, 511; 257/427, E27.005, 421, 257/414
See application file for complete search history.

(56) References Cited

U.S. PATENT DOCUMENTS

| | | | |
|---|---|---|---|
| 4,929,993 A | 5/1990 | Popovic | |
| 5,253,532 A | 10/1993 | Kamens | |
| 5,679,973 A | 10/1997 | Mochizuki et al. | |
| 6,441,460 B1 | 8/2002 | Vieback | |
| 6,903,429 B2 * | 6/2005 | Berndt et al. | ................. 257/414 |
| 7,474,093 B2 | 1/2009 | Ausserlechner | |
| 7,872,322 B2 | 1/2011 | Schott et al. | |
| 7,980,138 B2 | 7/2011 | Ausserlechner | |
| 8,164,149 B2 | 4/2012 | Schott | |

(Continued)

FOREIGN PATENT DOCUMENTS

| | | |
|---|---|---|
| EP | 0735600 A2 | 10/1996 |
| EP | 2071347 A2 | 6/2009 |

(Continued)

OTHER PUBLICATIONS

Office Action Dated Apr. 25, 2014 U.S. Appl. No. 13/530,296.

(Continued)

*Primary Examiner* — Yu-Hsi D Sun
*Assistant Examiner* — Christina Sylvia
(74) *Attorney, Agent, or Firm* — Eschweiler & Associates, LLC

(57) ABSTRACT

A vertical Hall sensor includes first and second vertical Hall effect regions in a semiconductor substrate, with first and second pluralities of contacts arranged at one side of the first or second vertical Hall effect regions, respectively. The second vertical Hall effect region is connected in series with the first vertical Hall effect region regarding a power supply. The vertical Hall sensor further includes first and second layers adjacent to the first and second vertical Hall effect regions at a side other than a side of the first or second pluralities of contacts. The first and second layers have different doping properties than the first and second vertical Hall effect regions and insulate the first and second vertical Hall effect regions from a bulk of the semiconductor substrate by at least one reverse-biased p-n junction per vertical Hall effect region during an operation of the vertical Hall sensor.

19 Claims, 15 Drawing Sheets

(56) References Cited

U.S. PATENT DOCUMENTS

| | | |
|---|---|---|
| 2005/0230770 A1 | 10/2005 | Oohira |
| 2006/0011999 A1 | 1/2006 | Schott et al. |
| 2008/0111565 A1 | 5/2008 | Ausserlechner et al. |
| 2009/0108839 A1 | 4/2009 | Ausserlechner |
| 2009/0256559 A1 | 10/2009 | Ausserlechner et al. |
| 2010/0123458 A1 | 5/2010 | Schott |
| 2010/0133632 A1 | 6/2010 | Schott |
| 2010/0252900 A1* | 10/2010 | Minixhofer et al. .......... 257/421 |
| 2011/0187350 A1* | 8/2011 | Ausserlechner et al. ..... 324/202 |
| 2012/0016614 A1 | 1/2012 | Hohe et al. |
| 2012/0056609 A1 | 3/2012 | Satoh |
| 2012/0241887 A1* | 9/2012 | Schott et al. .................. 257/427 |
| 2013/0342196 A1* | 12/2013 | Ausserlechner ............. 324/251 |

FOREIGN PATENT DOCUMENTS

| | | |
|---|---|---|
| EP | 2192417 A2 | 6/2010 |
| WO | 03036733 A2 | 5/2003 |
| WO | 2004025742 A1 | 3/2004 |

OTHER PUBLICATIONS

Notice of Allowance dated Dec. 31, 2013 for U.S. Appl. No. 13/541,863. 14 Pages.
Office Action dated Apr. 2, 2013 for U.S. Appl. No. 13/541,863.
M. Banjevic: "High Bandwith CMOS Magnetic Sensors Based on the Miniaturized Circular Vertical Hall Device." Master Thesis Presented Sep. 9, 2011.
C. Schott: "Linearizing integrated Hall Devices." International Conference on Solid State Sensors and Actuators. Jun. 16-19, 1997.
T. Kaufmann et al: "Novel complying concept for five-contact vertical hall devices", Transducers 2011, pp. 2855-2858. Jun. 5-9, 2011.
J. Cesaretti, Master Thesis. Georgia Institute of Technology. May 2008.
M. Denieve et al: Reference magnetic actuator for self calibration of a very small Hall sensor array. Swiss Federal Institute of Technology. Jun. 11, 2001.
Tamuracorp. "Current Sensor Info." Retrieved from tamuracorp.com/products/current-sensor-info. Retreived on Apr. 27, 2012.
T. Kaufmann et al.: "Piezo-Hall effect in CMOS-based Vertical Hall Devices." Department of Microsystems Engineering (IMTEK) University of Freiburg Freiburg, Germany. IEEE Copyright 2011.
Michael Demierre. "Improvements of CMOS Hall Microsystems and Application for Absolute Angular Position Management." Sep. 2003.
R. Popovic "Hall devices for magnetic sensor systems",Transducers'97, pp. 377-380. International Conference on Solid State Sensors and Actuators. Jun. 16-19, 1997.
U.S. Appl. No. 13/541,863, filed Jul. 5, 2012.
U.S. Appl. No. 13/530,296, filed Jun. 22, 2012.
Final Office Action Dated Nov. 6, 2014 U.S. Appl. No. 13/530,296.

* cited by examiner

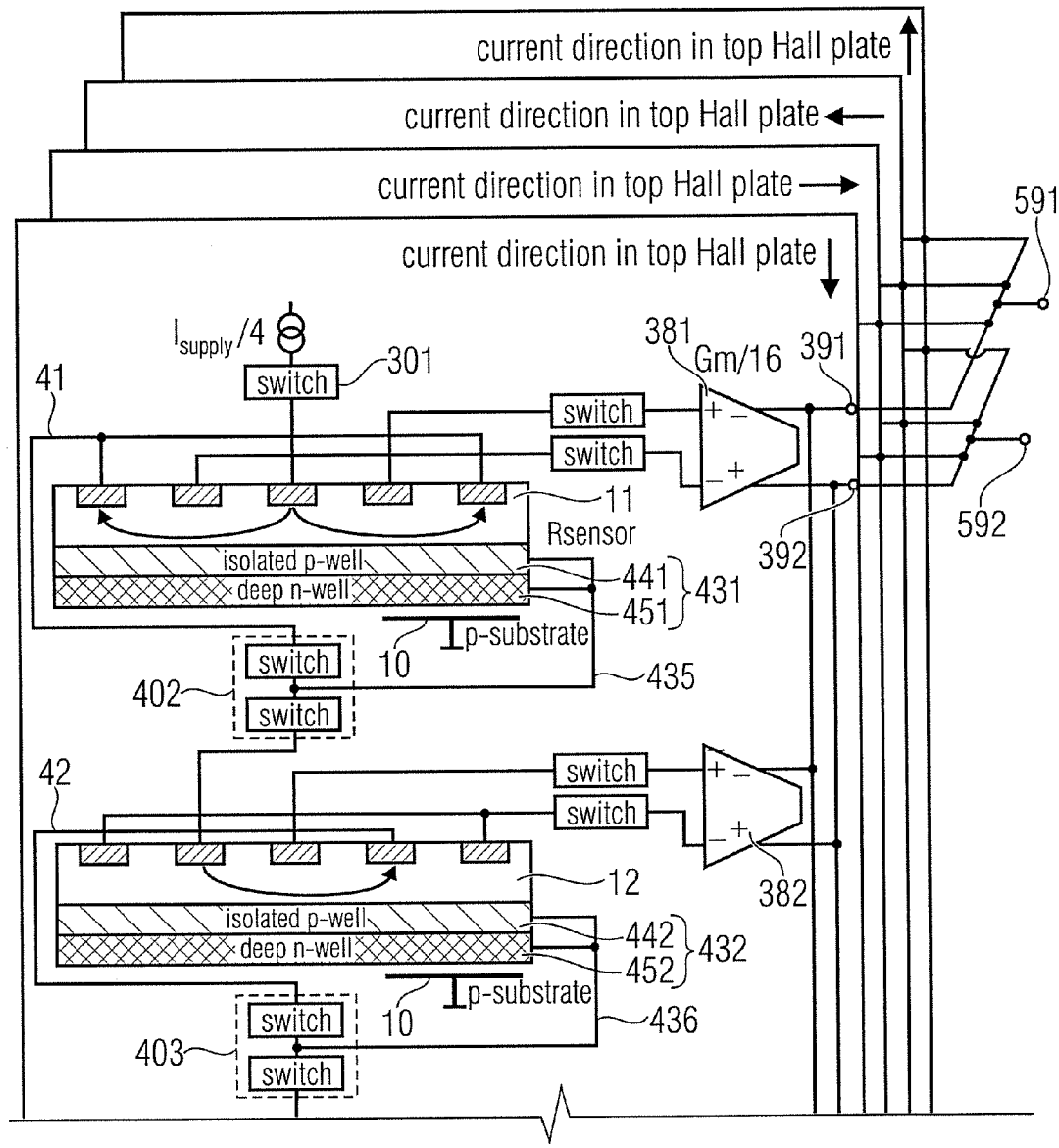
FIG 5A
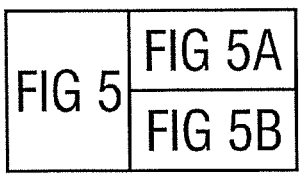
| FIG 5 | FIG 5A |
|---|---|
| | FIG 5B |

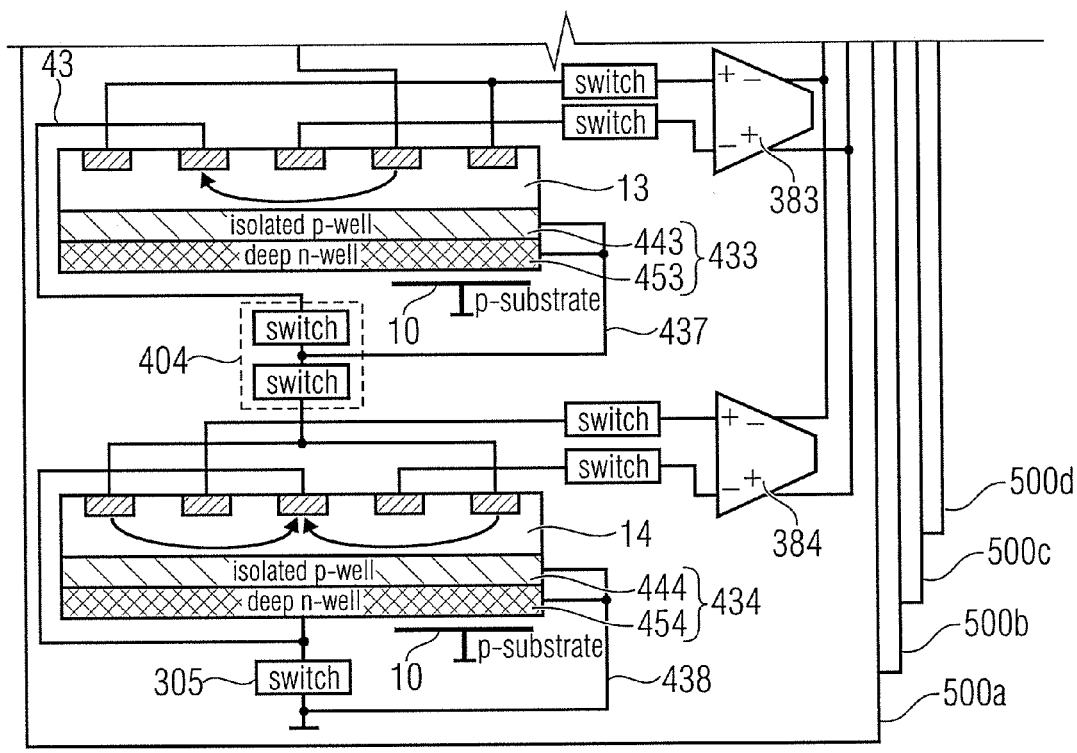
FIG 5B
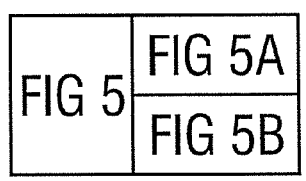
| FIG 5 | FIG 5A |
|---|---|
| | FIG 5B |

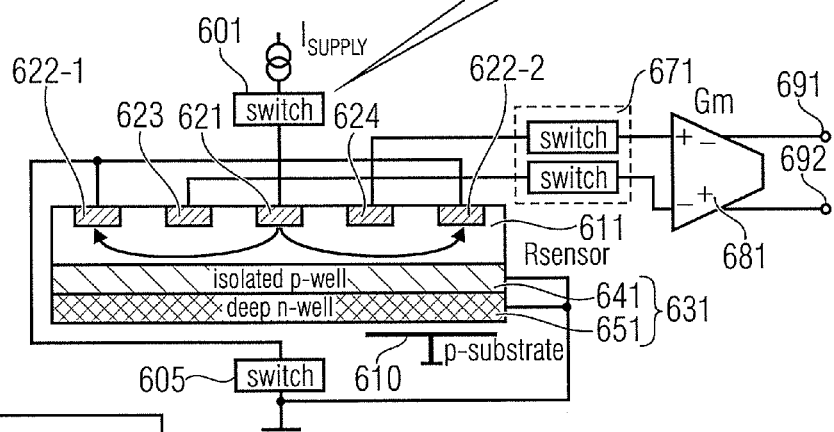

signal/noise and bias current and
supply voltage equvalent:

$4 \times I_{SUPPLY}/4 = I_{SUPPLY}$
$4 \times (R_{SUPPLY} \| R_{SUPPLY} \| R_{SUPP} \| R_{SUPP}) = R_{SUPPLY}$
16 parallel Rsense = 1/16 Rsense $<<$ Rsense
$16 \times Gm/16 = Gm$
signal / 4 $<$ signal
noise / 4 $<$ noise S/N $=$ S/N
But: Vbackbias/4 $<$ Vbackbias
→ 1/16 backbias effect $<<$ full backbias effect
stacked residual offset $<<$ unstacked or non-isolated backbias effect

FIG 6

| FIG 6A | FIG 6B |

Supplying electrical power to a vertical Hall sensor which comprises:
    a pair of supply terminals connectable to a power supply, a series connection of at least two vertical Hall effect regions interconnecting the pair of supply terminals, and at least two insulation arrangements between the at least two vertical Hall effect regions and the semiconductors substrate
thereby electrically insulating the at least two vertical Hall effect regions against the semiconductor substrate by reverse biasing at least two p-n junctions of which at least one portion is located within the at least two insulation arrangements

FIG 11

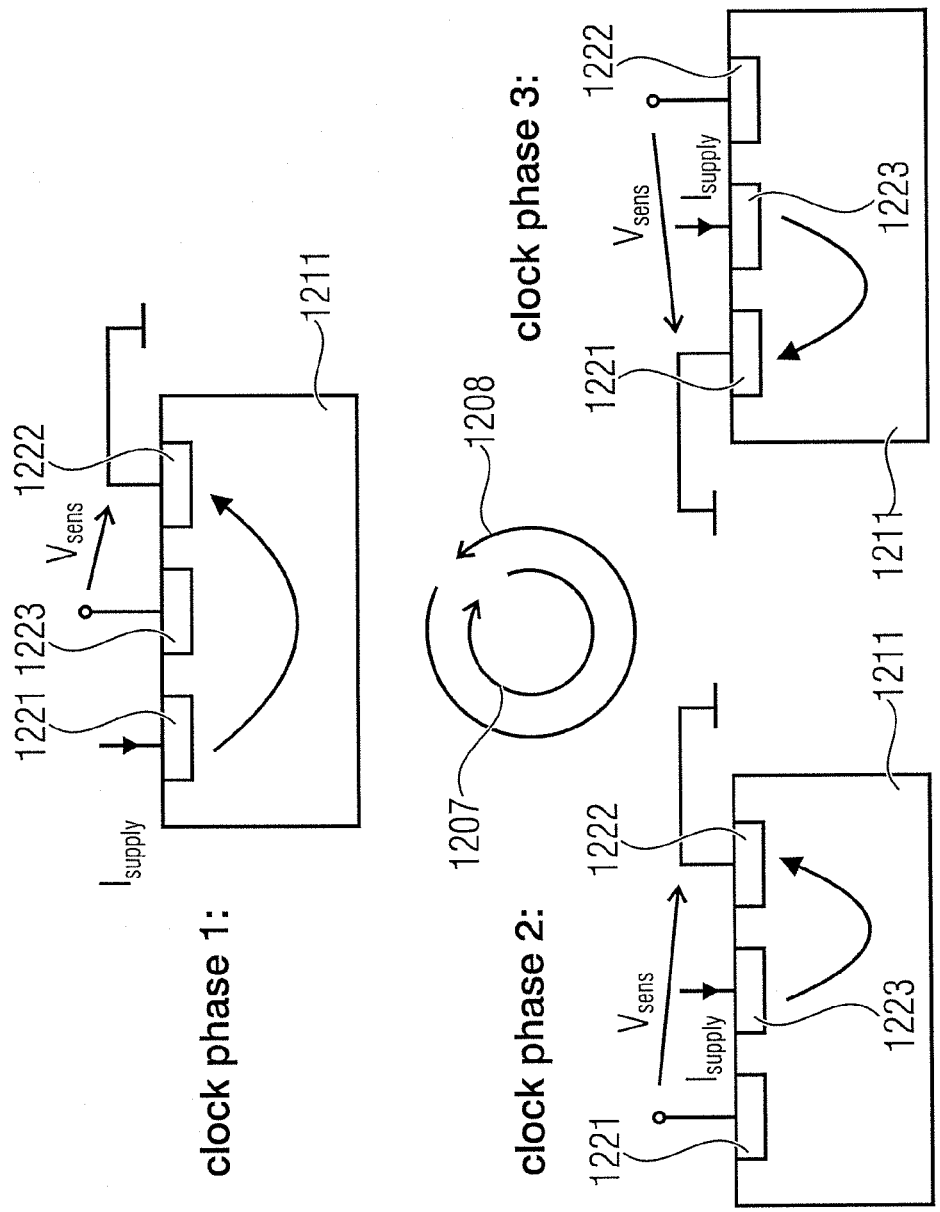

US 8,981,504 B2

VERTICAL HALL SENSOR WITH SERIES-CONNECTED HALL EFFECT REGIONS

FIELD

Embodiments of the present invention relate to a vertical Hall sensor. Further embodiments of the present invention relate to a method for operating a vertical Hall sensor. Further embodiments of the present invention relate to a stacked vertical Hall sensor with reduced back-bias effect.

BACKGROUND

Hall devices are extensively used in many kinds of applications for high precision magnetic measurement. Horizontal Hall devices or "Hall plates" are sensitive to the magnetic field component orthogonal to the chip plane. In contrast, vertical Hall sensors are capable of measuring in-plane magnetic field components. Both types of Hall sensors typically have a residual offset, i.e. a residual voltage or signal measured when the sensor is placed in a zero magnetic field. Horizontal Hall sensors or Hall plates can be designed to have a 90° rotational symmetry, for example. In combination with a so-called spinning current scheme it is typically possible to significantly reduce the residual offset error, because it partially cancels out when adding or subtracting output signals of the horizontal Hall sensor measured during different clock phases of the spinning current scheme. According to the spinning current technique, the supply contacts and the sense contacts of the Hall sensor are periodically swapped or changed in a round-robin (cyclic) manner. Vertical Hall sensors, on the other hand, typically show a relatively large inherent offset error. The spinning current scheme can also be applied to vertical Hall sensors, but its offset-reducing effect typically is not as high as with horizontal Hall sensors. The reason is that most designs for vertical Hall sensors do not provide a, for example, 90° symmetry with respect to supply contacts and sense contacts of the vertical Hall sensor.

Moreover, vertical Hall sensors are also affected by the so called junction-field-effect (JFE) in analogy to the working principle of the junction-field-effect transistor (JFET). The junction-field-effect is caused by a voltage-dependent thickness of an isolating depletion layer formed by a reverse biased p-n junction that confines the active volume or Hall effect region of the Hall sensor. During operation of the vertical Hall sensor, the Hall voltage and the magnetoresistance effect lead to potential variations inside the device and the active volume is deformed causing some kind of JFET-nonlinearity.

Basically, four different sources of non-ideal behavior can be distinguished from the output signal point-of-view of a Hall device. The Hall voltage and the magnetoresistance effect are both causing JFET non-linearity. Two other effects are referred to as material non-linearity and geometry related non-linearity. These latter two effects are technology-independent and typically exist also in any infinitely thin conventional Hall plate.

According to the junction-field-effect, the p-n junction in a buried semiconductor (e.g. silicon) Hall device between the shield (surrounding substrate) and active zone creates a voltage dependent depletion layer. The thickness of the depletion layer is not uniform, but varies locally and depends upon the local potential of the shield $V_S$, the active zone $V(x)$, the built-in potential of the junction $V_{bi}$, the material's permittivity $\varepsilon_s$, and the doping density $N_D$. Since the active zone is low to moderately doped and the shield S is heavily doped, the depletion layer thickness can be approximated by the formula of a one-sided abrupt $p^+$-n junction:

$$W(x) = \sqrt{\frac{2\varepsilon_S[V(x) + V_S + V_{bi}]}{qN_D}}$$

Taking the junction-field-effect into account, non-linearity in fields up to 2T can be as high as 2%.

SUMMARY

Embodiments of the present invention provide a vertical Hall sensor comprising a first vertical Hall effect region, a second vertical Hall effect region, a first layer adjacent to the first Hall effect region, and a second layer adjacent to the second Hall effect region. The first and second vertical Hall effect regions are formed in a semiconductor substrate. A first plurality of contacts is arranged at one side of the first vertical Hall effect region. The second vertical Hall effect region is of a same doping type as the first vertical Hall effect region. A second plurality of contacts is arranged at one side of the second vertical Hall effect region. The second vertical Hall effect region is connected in series with the first Hall effect region regarding a power supply to the first and second vertical Hall effect regions. The first layer is adjacent to the first Hall effect region at a side other than a side of the first plurality of contacts. The first layer has different doping properties than the first Hall effect region. The first layer is configured to insulate the first Hall effect region from a bulk of the semiconductor substrate by at least one reverse biased p-n junction during an operation of the vertical Hall sensor. The second layer is adjacent to the second vertical Hall effect region at a side other than a side of the second plurality of contacts and has different doping properties than the second vertical Hall effect region. The second layer is configured to insulate the second vertical Hall effect region from or against a bulk of the semiconductor substrate by at least one reverse biased p-n junction during an operation of the vertical Hall sensor.

Further embodiments of the present invention provide a vertical Hall sensor comprising a pair of supply terminals connectable to a power supply. The vertical Hall sensor further comprises a series connection of at least two vertical Hall effect regions inter-connecting the pair of supply terminals, wherein the at least two vertical Hall effect regions are formed in a semiconductor substrate. The vertical Hall sensor also comprises at least two insulation arrangements. Each insulation arrangement is adjacent to a corresponding vertical Hall effect region of the at least two vertical Hall effect regions at a substrate-facing surface of the corresponding vertical Hall effect region. The at least two insulation arrangements are configured to form at least two p-n junctions between the at least two vertical Hall effect regions and the semiconductor substrate that are configured to be reverse biased while an electrical power is supplied to the at least two vertical Hall effect regions using the pair of supply terminals.

Further embodiments of the present invention provide a method for operating a vertical Hall sensor. The method comprises supplying electrical power to at least a first vertical Hall effect region and a second vertical Hall effect region, both formed in a semiconductor substrate and connected in series regarding a power supply. The first and second vertical Hall effect regions are separated from a bulk of the semiconductor substrate by a first layer and a second layer, respectively, which have different doping properties than the first and second vertical Hall effect regions. The method further comprises reverse biasing at least a first p-n junction and a second p-n junction between the first and second vertical Hall effect regions, respectively, as a result of supplying the electrical power to the first and second vertical Hall effect regions, thereby insulating the first and second vertical Hall effect regions against the bulk of the semiconductor substrate. The method for operating the vertical Hall sensor also comprises sensing at least a first sense signal at a sense contact of the first vertical Hall effect region, and sensing a second sense signal at a sense contact of the second vertical Hall effect region. Furthermore, the method comprises changing supply contacts of the first and second vertical Hall effect regions according to a spinning current scheme so that the electrical power is supplied to the first and second vertical Hall effect regions using different supply contacts than during a preceding clock phase of the spinning current scheme. At least a further first sense signal is sensed at a new sense contact of the first vertical Hall effect region. Likewise, at least one further second sense signal is sensed at a new sense contact of the second vertical Hall effect region. The method also comprises determining an output signal based on a combination of the first sense signal, the second sense signal, the further first sense signal, and the further second sense signal.

Further embodiments of the present invention provide a method for operating a vertical Hall sensor which comprises a pair of supply terminals connectable to a power supply, a series connection of at least two vertical Hall effect regions interconnecting the pair of supply terminals, and at least two insulation arrangements. A first insulation arrangement of the at least two insulation arrangements is between a first vertical Hall effect region of the at least two vertical Hall effect regions and the semiconductor substrate. A second insulation arrangement of the at least two insulation arrangements is between a second vertical Hall effect region of the at least two vertical Hall effect regions and the semiconductor substrate. The method comprises supplying electrical power to the pair of supply terminals and thus to the series connection. In doing so, the at least two vertical Hall effect regions are electrically insulated against the semiconductor substrate by reverse biasing at least two p-n junctions, that is, one p-n junction between the first region and the semiconductor substrate, and another p-n junction between the second vertical Hall effect region and the semiconductor substrate. At least one portion of each p-n junction of the at least two p-n junctions is located within a corresponding one of the at least two insulation arrangements.

BRIEF DESCRIPTION OF THE FIGURES

Embodiments of the present invention will be described using the accompanying figures, in which:

FIG. 5 shows a schematic block diagram of a vertical Hall sensor comprising four series connections of four series-connected or "stacked" vertical Hall regions with isolating p-wells each, wherein the four series connections are parallel switched and have different current directions according to further embodiments;

FIG. 11 shows a schematic flow diagram of a method for operating a vertical Hall sensor according to further embodiments; and FIG. 12 schematically illustrates a spinning current scheme having three clock phases and two possible spinning directions for cycling through the spinning current scheme.

DETAILED DESCRIPTION

The following embodiments of the present invention will be described in detail using the accompanying figures. It is to be pointed out that the same elements or elements having the same functionality are provided with the same or similar references numbers and that a repeated description of elements provided with the same or similar reference numbers is typically omitted. Hence, descriptions provided for elements having the same or similar reference numbers are mutually exchangeable. In the following description, a plurality of details are set forth to provide a more thorough explanation of embodiments of the present invention. However, it will be apparent to one skilled in the art that embodiments of the present invention will be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

With respect to residual offset accuracy, vertical Hall sensors tend to suffer from back-bias effects in the sensor bridge. This nonlinear effect is caused by junction-field-effects in the sensor, which modulate the partial resistors in the Hall effect regions by extending the depletion region at higher Hall plate node voltages. These node voltages (which are referred to substrate voltage or potential) change at different spinning phases. As a result, no full cancellation of these nonlinear effects is possible, especially at higher supply voltages for the Hall effect region. This negative effect increases even more in vertical Hall sensors, because of their asymmetry and big initial imbalance. On the other hand, high supply voltages are preferred to increase the signal-to-noise ratio (SNR) of vertical Hall sensors.

Figure 1:
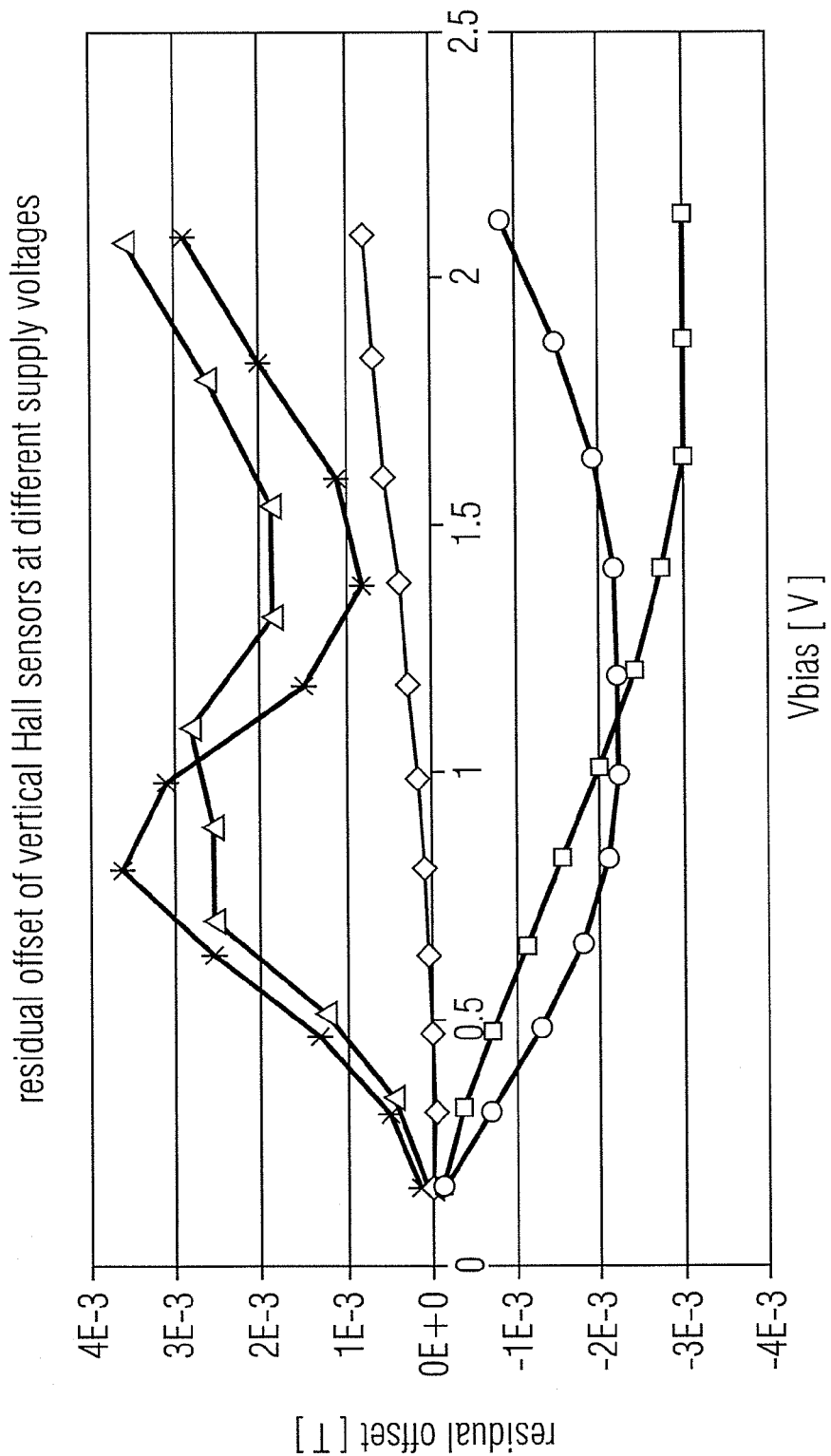
FIG. 1 shows a graph of the residual offset over supply voltage for several randomly selected sensors.

FIG. 1 schematically illustrates the dependency of the residual offset as a function of the supply voltage for five randomly selected sensors. It can be seen that at small supply voltages (up to approximately 0.7V) a mostly quadratic backbias effect is measured. For higher supply voltages greater than approximately 0.7V further nonlinear effects can be observed.

In horizontal Hall devices the offset reduction by means of the spinning current method is efficient due to the inherent geometric symmetry of horizontal Hall devices, i.e. the four-fold rotational symmetry or 90° rotational symmetry. As a consequence, a relatively high electrical symmetry of spinning phases can be expected in the spinning current method. For vertical Hall devices, however, this geometric symmetry cannot be reproduced in a satisfying way, as in vertical Hall devices the contacts are typically along one strip of semiconductor active region of limited depth.

Nonlinearities caused by the interaction of the junction-field-effect with fabrication imperfections, such as mask misalignments and doping gradients are assumed to be the main cause of the residual offset after the spinning current method. The residual offset is a nonlinear function of the supply current. By limiting the current density in the active sensor region, the residual offset may be reduced. In other words, low currents may be used for biasing (i.e., "providing power to") the vertical Hall device in order to achieve a relatively low residual offset. The downside is that the Hall voltage that can be measured at output contacts of the vertical Hall device is also reduced along with the decrease of the supply current. Accordingly, the ratio of the Hall voltage and the residual offset is relatively good for low supply currents. However, such low supply currents also cause the ratio of the Hall voltage and the voltage noise to be small, which degrades the vertical Hall sensor's performance. The voltage noise of the Hall device typically comprises two predominant portions, namely the 1/f noise, which scales down with the supply current, and thermal noise, which is independent of the supply current. It can be seen that at low supply currents a significant decrease of the signal-to-noise ratio has to be expected which in turn limits the resolution of the device.

In order to maintain signal-to-noise levels for vertical Hall devices biased at low currents, an array of devices may be used. The array topology may be described by the circuit theory terminology and in particular three basic array topologies may be used in connection with vertical Hall devices: parallel input—parallel output, series input—series output, and parallel input—series output topologies. Note that in particular the solution based on parallel input—parallel output topology may achieve an efficient offset reduction at the price of higher current consumption. As far as the series input—series output topology is concerned, devices efficiently use the same current and also voltage headroom that remains after proper biasing of electronics. It has to be noted that the characteristics of a single device or vertical Hall effect region depend on its position between supply lines due to the uneven influence of junction-field-effects. The series-connected or "stacked" devices are supplied by the same current and share a common substrate. Therefore, for devices closer to the positive supply rail the potential difference between devices' contacts and the substrate increases. A stronger influence of the junction-field-effect (JFE) on the active region of these devices has to be expected, which in turn leads to higher nonlinearities.

In other words, stacking (i.e. connecting in series) of vertical Hall sensors can be used to decrease the modulation, but a high influence especially at the vertical Hall effect region with the highest electrical potential to the bulk of the semiconductor substrate remains.

Figure 2:
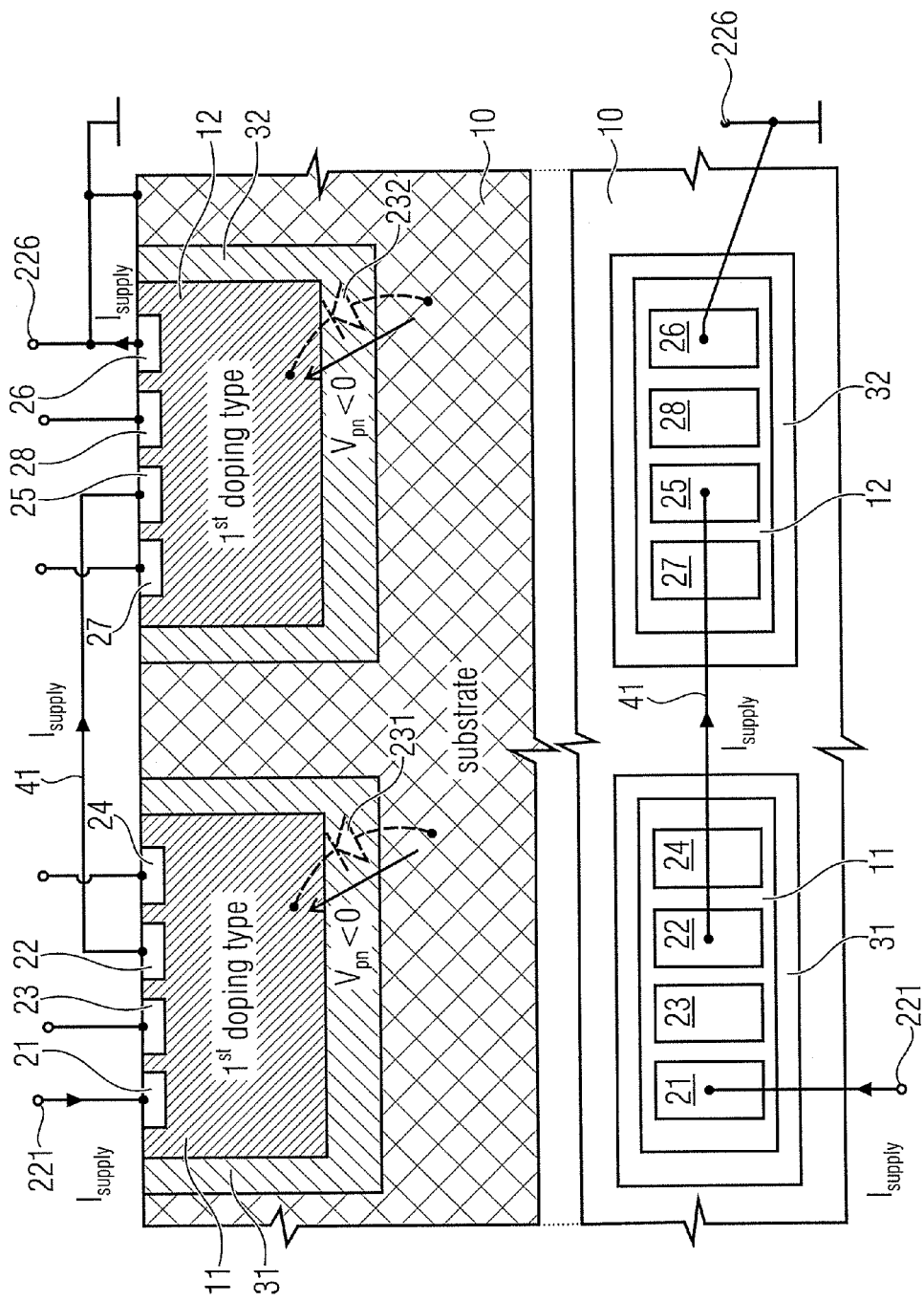
FIG. 2 shows a schematic cross section and a schematic top view of a vertical Hall sensor according to embodiments.

FIG. 2 shows a schematic cross section and a schematic top view of a vertical Hall sensor according to embodiments. The vertical Hall sensor comprises a first vertical Hall effect region 11 formed in a semiconductor substrate 10 with a first plurality contacts 21, 22, 23, and 24 arranged at one side of the first vertical Hall effect region 11. The vertical Hall sensor further comprises a second vertical Hall effect region 12 formed in the semiconductor substrate 10. The first and second vertical Hall effect regions 11, 12 are of the same doping type, i.e. a first doping type. For example, the first and second vertical Hall effect regions 11, 12 may be n-doped with a relatively low or moderate doping level. The doping level or concentration is typically approximately equal in the first and second vertical Hall effect regions 11, 12. In the alternative, the first and second vertical Hall effect regions 11, 12 may be p-doped with a relatively low or moderate doping level. A second plurality of contacts 25, 26, 27 and 28 is arranged at one side of the second vertical Hall effect region 12. Typically, the first and second plurality of contacts are arranged in or at a surface of the first and second vertical Hall effect devices 11, 12 that is close to a surface of the semiconductor substrate 10. In the embodiment illustrated in FIG. 2 the first plurality of contacts comprises four contacts 21 to 24. The same holds for the second plurality of contacts which also comprises four contacts 25 to 28. The number of four contacts per plurality of contacts is, however, only an example. According to other embodiments, the first and/or second plurality of contacts may comprise three contacts, five contacts or more contacts. The individual contacts of the first and second plurality of contacts are typically used in an alternating manner as supply contacts and sense contacts during a spinning current method or spinning current scheme. A spinning current scheme typically comprises at least two clock phases: the supply contacts used during a first clock phase become the sense contacts in a second clock phase, and vice versa. In the embodiment schematically illustrated in FIG. 2 the contacts 21 and 22 function as supply contacts for the first vertical Hall effect region 11, while the contacts 23 and 24 function as sense contacts for the first vertical Hall effect region 11. In particular, a sense signal (e.g. a voltage between the contacts 23 and 24 or an electrical current) can be acquired at or between the contacts 23 and 24. For the second vertical Hall effect region 12, the contacts 25 and 26 function as supply contacts, and the contacts 27 and 28 function as sense contacts.

With respect to a power supply, the first and second vertical Hall effect regions 11, 12 are connected in series, because the contact 22 of the first vertical Hall effect region and the contact 25 of the second vertical Hall effect region 12 are connected by a connection 41. The contact 21 is connected to a high supply potential and the contact 26 is connected to a low supply potential, for example ground potential, during an operation of a vertical Hall sensor. Therefore, a supply current $I_{supply}$ flows into the first vertical Hall effect region 11 at or using the contact 21, leaves the first Hall effect region 11 at or using the contact 22, flows along the connection 41 to the contact 25 where it enters the second vertical Hall effect region 12, and finally leaves the second vertical Hall effect region 12 at or using the contact 26. Note that within both the first and second vertical Hall effect regions 11, 12 the supply current $I_{supply}$ flows along substantially arc-shaped current streamlines from the high potential supply contacts 21 and 25, respectively, to the low potential supply contacts 22 and 26, respectively, in a counterclockwise direction. Alternatively, the supply current may also flow in a clockwise direction in both vertical Hall effect regions 11, 12 or in opposite directions (clockwise and counterclockwise) in both vertical Hall effect regions 11, 12. According to the embodiment schematically illustrated in FIG. 2, substantially the entire supply current $I_{supply}$ provided to the first vertical Hall effect region 11 is conducted along the connection 41 and thus supplied to the second vertical Hall effect region 12, except for possible leakage currents (typically negligible). At the contact 26 the entire supply current $I_{supply}$ leaves the second vertical Hall effect region 12. Due to the series connection of the first and second Hall effect regions 11, 12, the first vertical Hall effect region 11 has the second vertical Hall effect region 12 as the only successor with respect to a current path of the supply current $I_{supply}$. The second vertical Hall effect region 12 has the first vertical Hall effect region 11 as the only predecessor in the current path of the supply current $I_{supply}$. Furthermore, the supply current is not split up into two or more parts within the first vertical Hall effect region 11 and then conducted to the second vertical Hall effect region 12 using two or more connections between the first and second vertical Hall effect regions 11, 12. Instead, only the single connection 41 is used to conduct the supply current $I_{supply}$ from the first vertical Hall effect region 11 to the second vertical Hall effect region 12. In other words, the first vertical Hall effect region 11 may be regarded as having a single output node which coincides with a single input node of the second vertical Hall effect region 12. In the embodiment schematically illustrated in FIG. 2, the single output node of the first vertical Hall effect region 11 and the single input node of the second vertical Hall effect region 12 are provided by the connection 41. From the previous explanations it can be seen that the series connection of the first and second vertical Hall regions 11, 12 according to embodiments differs from, for example, a rhomboid-like or ring-like connection of two or more vertical Hall effect regions, in which two or more connections are provided between the different vertical Hall effect regions, the two or more connections typically being at different electrical potentials.

In order to electrically insulate the first and second vertical Hall effect regions 11, 12 against a bulk of the semiconductor substrate 10, the vertical Hall sensor according to the embodiment illustrated in FIG. 2 comprises a first layer 31 and a second layer 32. The first layer 31 is adjacent to the first vertical Hall effect region 11 at a side other than a side of the first plurality of contacts. As it can be seen in the schematic cross section and the schematic top view of FIG. 2, the first layer 31 substantially encases the first vertical Hall effect region 11 at five sides (three sides are visible in the cross section, four sides are visible in the top view). The first layer 31 has different doping properties than the first Hall effect region 11. For example, the first layer 31 may have another doping type. According to some embodiments, the first vertical Hall effect region 11 may be n-doped and the first layer 31 may be p-doped, or vice versa. According to other embodiments, the first layer 31 may have the same doping type but a different doping concentration or doping level than the first vertical Hall effect region 11.

The doping type of the first layer 31 is chosen so that in combination with the first doping type of the first vertical Hall effect region 11 and a doping type of the bulk of the substrate 10, at least one p-n junction is formed between the first vertical Hall effect region 11 and the bulk of the semiconductor substrate 10. This is schematically indicated in the cross section of FIG. 2 by an imaginary diode 231, drawn in dashed line. As can be seen in FIG. 2, the p-portion of the p-n junction is closer to the bulk of the substrate 10 than an n-portion of the p-n junction and the n-portion of the p-n junction is closer to the vertical Hall effect region 11. Note that the p-n junction may be formed between the first layer 31 and the first vertical Hall effect region 11, or between the bulk of the substrate 10 and the first layer 31. As the bulk of the substrate 10 is electrically connected to ground potential and, during operation of the vertical Hall sensor, even the lowest electrical potential occurring within the first vertical Hall effect region 11 is higher than the ground potential, the p-n junction is reverse-biased, as indicated by the voltage across the p-n junction $V_{pn}<0$ in the schematic cross section of FIG. 2. The reverse-biased p-n junction electrically insulates the first vertical Hall effect region from the bulk of the semiconductor substrate and reduces a junction-field-effect within the first vertical Hall effect region caused by an electrical potential difference between the first vertical Hall effect region and the bulk.

The vertical Hall sensor further comprises a second layer 32 adjacent to the second vertical Hall effect region 12 at a side (or several sides) other than a side of the second plurality of contacts. The second layer 32 has different doping properties than the second vertical Hall effect region 12 and is configured to insulate the second Hall effect region 12 from the bulk of the semiconductor substrate 10 by at least one reverse-biased p-n junction during an operation of the vertical Hall sensor, as indicated by the imaginary diode 232, drawn in dashed line in FIG. 2. Even though in the configuration illustrated in FIG. 2 the contacts 26 of the second plurality of contacts is at ground potential, the interface between the second vertical Hall effect region 12 and the second layer 32 is at a higher potential during operation of the vertical Hall sensor. As explained in connection with the p-n junction represented by the diode 231, also the p-n junction between the bulk of the semiconductor substrate 10 and the second vertical Hall effect region 12 is reverse-biased and thus electrically insulating. The second layer 32 reduces a junction-field-effect within the second vertical Hall effect region caused by an electrical potential difference between the second vertical Hall effect region and the bulk.

The vertical Hall sensor schematically illustrated in FIG. 2 may also be described as comprising a pair of supply terminals 221, 226 which are connectable to a power supply. The vertical Hall sensor further comprises a series connection of at least two vertical Hall effect regions 11, 12, the series connection inter-connecting the pair of supply terminals 221, 226. The at least two vertical Hall effect regions 11, 12 are formed in a semiconductor substrate 10. The vertical Hall sensor also comprises at least two insulation arrangements 31, 32. Each insulation arrangement 31, 32, is adjacent to a corresponding vertical Hall effect region 11, 12, respectively, at a substrate-facing surface (or bulk-facing surface) thereof. The at least two insulation arrangements 31, 32 are configured to form at least two p-n junctions, wherein a first p-n junction is formed between the first vertical Hall effect region 11 and the semiconductor substrate 10, and the second p-n junction is formed between the second vertical Hall effect region 12 and the semiconductor substrate 10. The p-n junctions are configured to be reverse-biased while electrical power is supplied to the at least two vertical Hall effect regions 11, 12 using the pair of supply terminals 221, 226. Typically, the electrical power supplied to the at least two vertical Hall effect regions 11, 12 during operation causes the p-n junctions to become reverse-biased.

In some embodiments the first layer or insulating arrangement 31 and the second layer or insulating arrangement 32 may have a higher doping level than the first vertical Hall effect region 11 and the second vertical Hall effect region 12.

According to at least some further embodiments the first layer or first insulating arrangement 31 may be adjacent to the bulk of the semiconductor substrate 10 at a side of the first vertical Hall effect region opposite to or other than a side of the first vertical Hall effect region 11 where the first plurality of contacts are arranged. The second layer or second insulating arrangement 32 may be adjacent to the bulk of the semiconductor substrate at a side of the second Hall effect region 12 opposite to or other than a side of the second vertical Hall effect region 12 where the second plurality of contacts are arranged. According to some embodiments, the first layer 31 may arranged at a lower surface of the first vertical Hall effect region 11, only. According to alternative embodiments, the first layer 31 may be arranged at the lower surface and one or more side surfaces of the first vertical Hall effect region 12. The same is true for the second layer 32 and the second vertical Hall effect region 12.

The first layer or first insulating arrangement 31 and the second layer/insulating arrangement may be at least one of: an n-buried layer, two separate portions of a n-buried layer, a p-buried layer, and two separate portions of a p-buried layer. Typically, a n-buried layer or a p-buried layer is formed relatively early during a semiconductor manufacturing process and extends at a certain depth within the semiconductor substrate 10 substantially across the entire area of the semiconductor substrate 10. The n-buried layer or p-buried layer thus typically forms a layer of high electrical conductivity with a substantially uniform electrical potential. With a view to the first layer/insulating arrangement 31 and the second layer/insulating arrangement 32 this may mean that the first and second layers/insulating arrangements 31, 32 may be at least partially short circuited, in case an n-buried layer or a p-buried layer is used or forms a part of the first insulating arrangement 31 and/or the second insulating arrangement 32. In some embodiments, the n-buried layer or the p-buried layer may be subdivided into two or more portions by means of a layer insulating arrangement. For example, the layer insulating arrangement may comprise one or more deep trenches that reach down to the depth of the n-buried layer or the p-buried layer, or even beyond this depth.

Most embodiments disclosed herein are designed, among other things, with the intention to increase the symmetry at the sensing nodes and to thus reduce the residual offset after spinning of the vertical Hall devices.

At least some embodiments propose a stacking or serially connecting of vertical Hall effect regions which have an n-buried layer (n-BL) between p-substrate and the vertical Hall effect region 11, 12.

This reduces nonlinear modulating effects to the high resistive n-well or n-Epi layer of the vertical Hall device and thus residual offset is reduced (pinch effect).

Additional leakage currents at high temperatures are reduced by the high doped buried layer. Thus the rising residual offset at high temperature is reduced.

Alternative embodiments propose a stacking or serially connecting of vertical Hall effect regions which have a floating p-well or p-layer between the vertical Hall effect region 11, 12 and the p-substrate. The floating p-well/layer is connected to the lowest electrical potential of the same stack as the vertical Hall effect region 11, 12. This also reduces modulating effects from substrate and leakage currents at higher temperatures. In further embodiments, a parallel (or antiparallel) switching of vertical Hall effect regions in each stack may be provided in order to lower the noise and increase the symmetry of the vertical Hall effect region 11, 12. White noise is determined by $Vn=SQRT(4\ kTB*Rsense)$, where K=Boltzmann constant
T=absolute Temperature
B=Bandwidth of the signal processing system.

By parallel switching the output resistance Rsense between sensing nodes of the vertical Hall device is reduced, which in turn also reduces the noise, as can be seen in the above indicated equation.

Antiparallel switching of vertical Hall devices reduces the asymmetry between the middle and outer contacts of the vertical Hall device and thus reduces initial offset. Thus the signal swing for amplifier input stages is reduced, which avoids saturation effects of the signal in this input stages.

In further embodiments a parallel and/or 90° switching of output nodes of vertical Hall devices via different summing amplifier inputs is proposed. According to a 90° switching technique, several Hall devices are connected in parallel but are operated in different spinning directions in order to increase the symmetry between all spinning phases.

According to some further embodiments, more than one series connection or "stack" may be provided. This reduces furthermore the residual offset after spinning by lowering the supply voltage for each Hall device at a given maximum supply voltage for series connected Hall devices. Half of the stacks may then have another spinning direction than the other half of the stacks. This compensates dynamic spikes in the output signal of the sensor, caused by opposite dynamic charge flow during switching between different spinning directions. Furthermore, the spinning direction may be changed in each stack with a clock≤fspin$_{90°}$/2. This averages the dynamic spikes in time domain. More generally, each stack may have another spinning direction or spinning current scheme, i.e. a different succession of the various possible configurations for the supply contacts and the sense contacts of the at least two different vertical Hall effect regions. This enables additional averaging and compensation of switching spikes and thus reduces the residual offset. In addition or alternatively, each stack or series connection may have a group of vertical Hall effect regions which spins in one spinning direction and a second group of vertical Hall effect regions which spins in another spinning direction. In each group a symmetrization of separate Hall devices is preferred to reduce big initial offset values (e.g. by antiparallel connected Hall devices).

At least some embodiments may lead to a decrease of the back-bias voltage modulation effect. This may be caused by high doped n-buried layer (less depletion region and its modulation) or because of lower voltage and its modulation between a p-doped insulating layer to the vertical Hall region voltage. Thus, the residual offset decreases significantly (factor 4 . . . 16) because of approximately quadratic voltage dependency.

A further embodiment comprises a deep trench isolation to separate the stacked Hall devices. This leads to smaller leakage current at high temperatures, which is required by the smaller signal of stacked Hall devices, caused by smaller supply voltages and thus smaller sensitivities for each stacked Hall device.

Figure 3A:
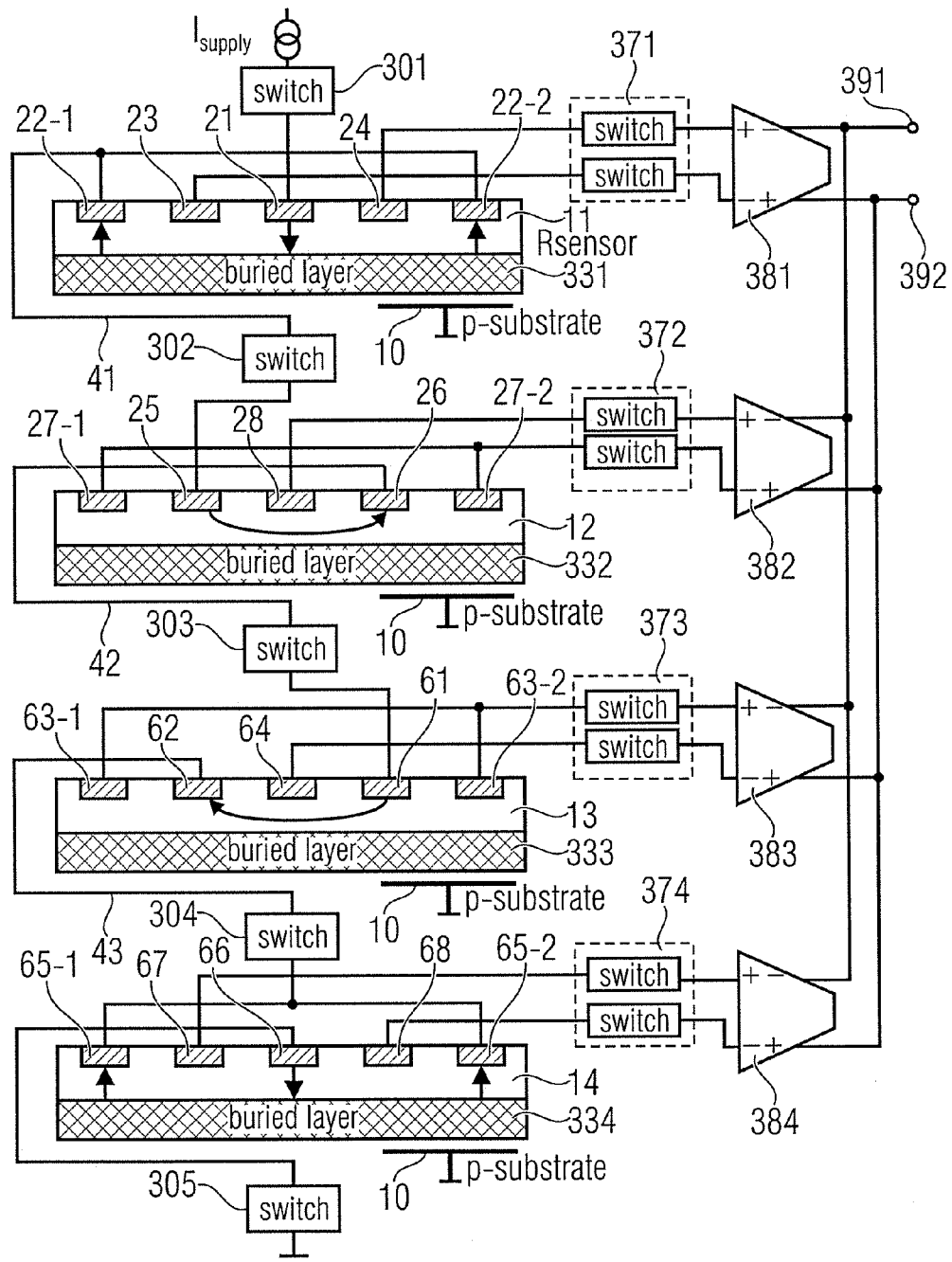
FIG. 3A shows a schematic block diagram of a vertical Hall sensor which comprises four series-connected or "stacked" vertical Hall devices with n-buried layer according to further embodiments.

FIG. 3A shows a schematic block diagram of a vertical Hall sensor comprising four series-connected vertical Hall effect regions 11, 12, 13, and 14. FIG. 3A shows the stacked vertical Hall regions 11 to 14 in one spinning phase and additionally different supply current directions in each vertical Hall effect region 11 to 14. The modulating back-bias effect from substrate is greatly reduced by a low ohmic highly doped n-buried layer 331, 332, 333, and 334.

The series connection of the four vertical Hall effect regions 11 to 14 is connected to a current source Ibias. A first switch element or switch matrix 301 is connected between the current source Ibias and the contact 21 of the first vertical Hall effect region 11. According to embodiments the output side of the switch element 301 may be connected to several contacts of the first plurality of contacts 21, 22-1, 22-2, 23, and 24, which is associated with the first vertical Hall effect region. For the sake of clarity of the illustration, only the currently active connection between the switch element 301 and the first plurality of contacts is drawn in FIG. 3A.

A further switch element or switch matrix 302 is connected between the first plurality of contacts 21 to 24 and the second plurality of contacts 25, 26, 27-1, 27-2, and 28, associated with the second vertical Hall effect region 12. The switch element 302 may be connected to several contacts of the first plurality of contacts and/or to several contacts of the second plurality of contacts. Again, for the sake of clarity, only the currently active (e.g., during clock phase 1 of the spinning current scheme) connections are shown in FIG. 3A. The switch element 302 may be configured to selectively connect a particular contact of the first plurality of contacts 21 to 24 with a particular contact of the second plurality of contacts 25 to 28. In this manner, different current directions can be implemented within the first vertical Hall effect region 11 and the second vertical Hall effect region 12. In the configuration schematically illustrated in FIG. 3A the current source Ibias is connected, via the switch element 301, to the center contacts 21 to 24. Accordingly, the contact 21 may be regarded as the high potential supply contact for the first vertical Hall effect region 11. The pair of outmost contacts 22-1 and 22-2 form the low potential supply contacts for the first vertical Hall effect region 11. As such, the contacts 22-1 and 22-2 are connected, via the switch element 302, to the contact 25 of the second plurality of contacts 25 to 28. The contact 25 functions as a high supply potential contact for the second vertical Hall effect region 12. The contact 26 functions as the corresponding low supply potential contact for the second vertical Hall effect region 12. In the first vertical Hall effect region the current flows substantially vertically from the contact 21 to the buried layer 331. The current flows towards the left and right edges of the buried layer 331 where it leaves the buried layer 331 and flows substantially vertically upwards to the contacts 22-1 and 22-2 through the active region of the first vertical Hall effect region 11. In the second vertical Hall effect region 12 a major part of the current entering the second vertical Hall effect region 12 at the contact 25 can be assumed to flow along an arc-shaped trajectory through the active region of the second vertical Hall effect region 12 to the low supply potential contact 26, i.e. from left to right. The switch elements 303 and 304 function in substantially the same manner as the switch element 302.

A third plurality of contacts 61, 62, 63-1, 63-2, and 64 is arranged at one side of the third vertical Hall effect region 13. A fourth plurality of contacts 65-1, 65-2, 66, 67 and 68 is arranged at one side of the fourth vertical Hall effect region 14. The outmost contacts of each plurality of contacts are pair-wise electrically connected to each other. More precisely, the outmost contacts 22-1, 22-2 of the first plurality of contacts are connected or short-circuited to each other. The outmost contacts 27-1, 27-2 of the second plurality of contacts are electrically connected or short circuited to each other. The outmost contacts 63-1, 63-2 of the third plurality of contacts are electrically connected or short-circuited to each other. The outmost contacts 65-1 and 65-2 of the fourth plurality of contacts are electrically connected or short-circuited to each other.

A further switch element or switch matrix 305 is connected, on a high potential side, to the fourth plurality of contacts 65-1, 65-2 to 68. At the low potential side the switch element 305 is connected to ground potential.

The vertical Hall sensor schematically illustrated in FIG. 3A further comprises four switch arrangements 372, 372, 373, and 374 on respective output sides of the first, second, third, and fourth vertical Hall effect regions 11, 12, 13, 14.

Using the switch arrangements 371 to 374, the currently active sense contacts of the first, second, third, and fourth plurality of switches can be connected to the inputs of amplifiers 381, 382, 383, and 384. Again, only the currently active connections are drawn in FIG. 3A. For example, the non-inverting input of amplifier 381 is connected, via the upper switch of the switch arrangement 371, to the contact 24. The inverting input of the amplifier 381 is connected, via the lower switch of the first switch arrangement 371, to the contact 23. The outputs of the amplifiers 381 to 384 are coupled together to form a pair of output terminals 391 and 392. The amplifiers 381 to 384 may be differential amplifiers that are configured to amplify a voltage difference between the inverting input and the non-inverting input, but not (or only to a negligible degree) a common mode of the input voltages at the inverting and the non-inverting inputs of the respective amplifier. In addition or in the alternative, the amplifiers 381 to 834 may be transconductance amplifiers (voltage-to-current amplifiers) so that the output currents of the amplifiers 381 to 384 may be summed at the circuit nodes represented by the terminals 391 and 392.

An electrical insulation of the four vertical Hall effect regions 11 to 14 against the p-doped substrate 10 is achieved by the fact that p-n junctions are formed between the p-substrate and the n-doped buried layers 331 to 334. Moreover, the p-substrate 10 is at ground potential but the buried layers 331 to 334 are at higher electrical potentials during an operation of the vertical Hall sensor, due to an electrical power supplied to the series connection of the four vertical Hall effect regions 11 to 14 by the current source Isupply. Accordingly, the p-n junctions between the p-substrate 10 and the n-buried layers 331 to 334 are reverse-biased and therefore substantially non-conducting. As the buried layers 331 to 334 are relatively heavily doped, the depletion regions within the buried layers are relatively narrow. Furthermore, the heavily doped buried layers 331 to 334 may also cause an equalization of electrical potential within the buried layer and also in an adjacent interface region of the first to fourth vertical Hall effect regions 11 to 14. The narrow depletion region and/or the equalized potential distribution are assumed to reduce the back-bias effect within the vertical Hall effect regions 11 to 14.

In embodiments at least one of the switch elements 302, 303, and 304 may comprise a first n-throw switch element and a second n-throw switch element (the expression "n-throw switch" may be regarded as a generalization of the expression "double-throw switch"). The first n-throw switch element may be connected on an n-throw side to at least two contacts of one of the plurality of contacts and on a common terminal side to a first circuit load. The second n-throw switch element may be connected on a common terminal side to the first circuit node and on an n-throw side to at least two contacts of another plurality of contacts. The first and second n-throw switch elements may be implemented by n basic switches, for example field effect transistors, bipolar transistors or other solid state switches. At least according to some embodiments the switch elements 302, 303, and 304 may be interconnected between at least two first contacts of a plurality of contacts and at least two second contacts of another plurality of contacts. The switch element may then be configured to interconnect the at least two first contacts and the at least two second contacts in different configurations.

Yet another option is to provide a switch matrix interconnected between a plurality of contacts and another plurality of contacts. The switch matrix may be configured to provide a plurality of different interconnection configurations between the contacts of the two pluralities of contacts.

The first, second, third and fourth plurality of contacts may be interconnected with each other so that each of the first, second, third, and fourth vertical Hall effect regions 11 to 14 is operated in a different clock phase of a four-phase spinning current scheme, as schematically illustrated in FIG. 3A. The four different clock phases in FIG. 3A may be referred to as "down", "right", "left", and "up" for the vertical Hall effect regions 11, 12, 13 and 14, respectively.

The four differential amplifiers 381 to 384 may be replaced by one or several different summing amplifiers configured to sum a first potential difference between two first sense contacts of one plurality of contacts and a second potential difference between two second sense contacts of another plurality of contacts. In at least some embodiments the first vertical Hall effect region 11 may be operated according to a spinning current scheme with a first spinning direction and the second vertical Hall effect region 12 may be operated according to a spinning current scheme with a second spinning direction. In particular, the first spinning direction may be opposite to the second spinning direction. The spinning current schemes used by the first and second vertical Hall effect regions 11, 12 may be the same, except for the different or opposite spinning directions.

The vertical Hall sensor may comprise a first differential amplifier 381 connected on an input side to sense contacts 23, 24 of the first plurality of contacts. The vertical Hall sensor may also comprise a second differential amplifier 382 connected on an input side to sense contacts 27, 28 of the second plurality of contacts. Respective outputs of the first and second differential amplifiers 381, 382 may be combined to provide an output signal of the vertical Hall sensor, for example at the output terminals 391, 392.

Figure 3B:
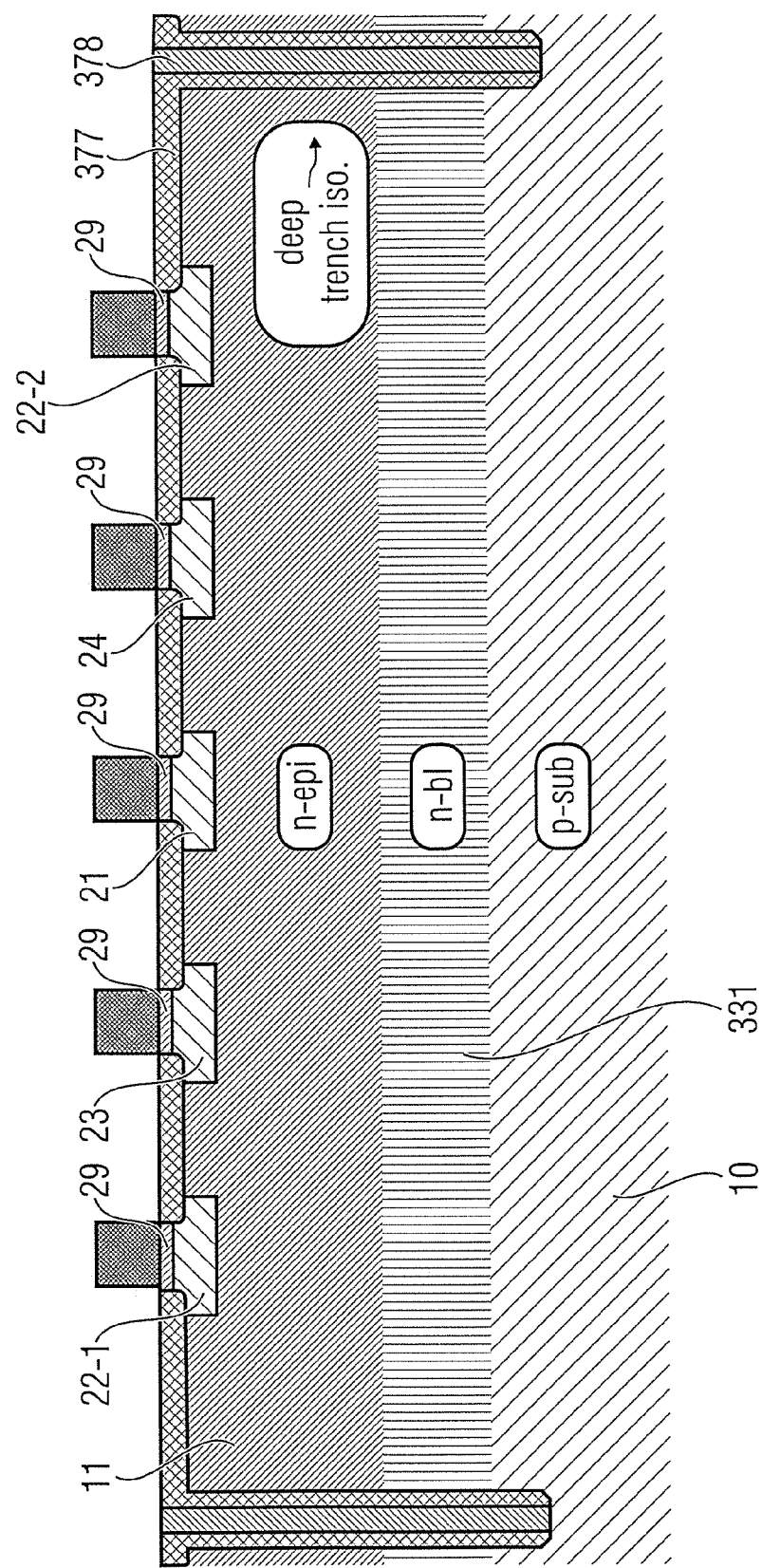
FIG. 3B shows a cross section of a vertical Hall device used in the vertical Hall sensor shown in FIG. 3A.

FIG. 3B shows a schematic cross section of a first vertical Hall device of the vertical Hall sensor illustrated in FIG. 3A. The three other vertical Hall devices typically have a similar or identical structure. The n-doped buried layer 331 is located between the vertical Hall effect region 11 and the p-doped substrate 10. The first plurality of contacts 22-1, 23, 21, 24, 22-2 is arranged at an upper surface of the vertical Hall effect region 11. The contacts 22-1, 23, 21, 24, 22-2 may be connected using a plurality of tungsten plugs (W-plugs) 29.

The vertical Hall effect region 11 is laterally bounded by a deep trench isolation which comprises an isolation layer 377 and a filling 378. The isolation layer 377 also extends along the upper surface of the vertical Hall effect region 11. The deep trench isolation also isolates the portion of the n-buried layer 331 that is immediately beneath the vertical Hall effect region 11 from other portions of the n-buried layer 311 that are immediately beneath other vertical Hall effect regions 12, 13, 14, for example. In this manner, the different portions of the n-buried layer 311 are electrically isolated against each other and may have different electric potentials.

In the embodiment shown in FIG. 3B, the vertical Hall effect region 11 is a portion of a n-doped epitaxial layer.

A combination of a buried layer 331 and a deep trench isolation 377, 378 for stacked (i.e., electrically stacked) Hall devices typically reduces very effectively the residual offset caused by JFET modulation effects and leakage currents at high temperature.

Figure 4:
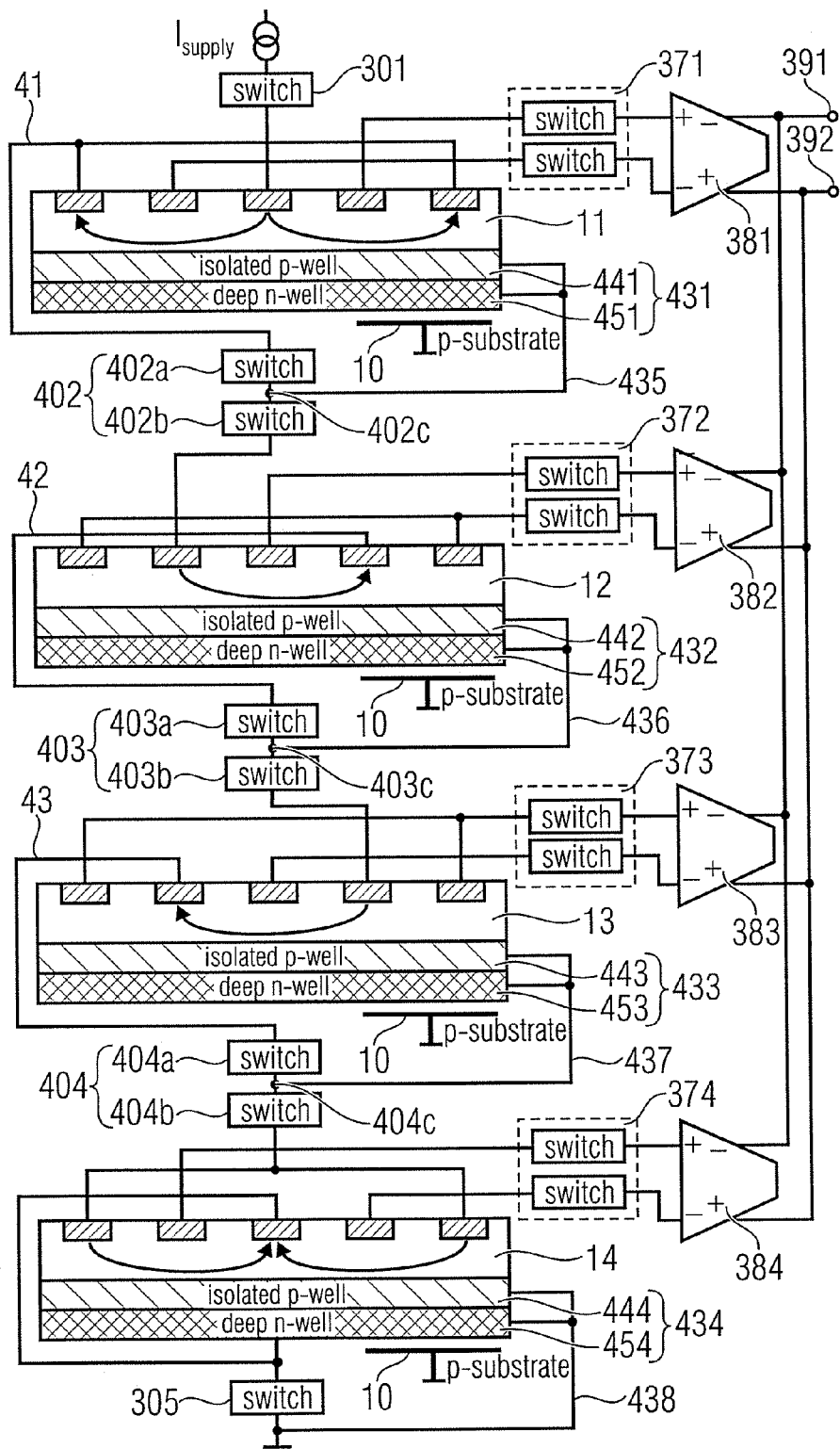
FIG. 4 shows a schematic block diagram of a vertical Hall sensor which comprises four series-connected or "stacked" vertical Hall regions with isolating p-well according to further embodiments.

FIG. 4 shows a schematic block diagram of a vertical Hall sensor according to further embodiments. The vertical Hall sensor comprises four vertical Hall effect regions 11 to 14 which are connected in series with respect to a power supply provided by a current source Ibias. The embodiment schematically illustrated in FIG. 4 differs from the embodiment schematically illustrated in FIG. 3A in that the insulating arrangements 431, 432, 433, 434 comprise additional layers 451, 452, 453, and 454 in addition to the layers 441, 442, 443, and 444. The switch elements between the first, second, third, and fourth pluralities of contacts are different in the embodiments according to FIGS. 3A and 4, as well. The insulating arrangement 431 of the first vertical Hall effect region 11 and the second insulating arrangement 432 of the second vertical Hall effect region 12 are now described in a representative manner for all four insulating arrangements 431 to 434. The first insulating arrangement 431 comprises the first layer 441 which has a different doping type than the first vertical Hall effect region 11. In a similar manner, the second insulating arrangement 432 comprises the second layer 442 which also has a different doping type than the second Hall effect region 12. The vertical Hall sensor further comprises a first additional layer 451 between the first layer 441 and the bulk 10 for electrically insulating the first layer from the bulk. The vertical Hall sensor also comprises a second additional layer 452 between the second layer 442 and the bulk 10 for electrically insulating the second layer 442 from the bulk. The first layer 441 and the first additional 451 are part of the first insulating arrangement 431. The second layer 442 and the second additional layer 452 are part of the second insulating arrangement 432. The first layer and the second layer are implemented as isolated p-layers or p-wells in the embodiment illustrated in FIG. 4. The first and second additional layers 451, 452 are implemented as deep n-layers or n-wells in the embodiment according to FIG. 4. When following a path from the bulk of the semiconductor substrate 10 into the first vertical Hall effect region 11, it can be seen that three p-n junctions are formed by the different layers 10, 451, 441 and 11. A first p-n junction is formed between the p-substrate 10 and the first additional layer ("deep n-well") 451. A second p-n junction is formed between the first additional layer 451 and the first layer 441 ("isolated p-well"). The third p-n junction is formed between the first layer 441 and the first vertical Hall effect region 11. During operation of the vertical Hall sensor the electrical potential of the semiconductor substrate 10 is typically lower than the electrical potential within the first vertical Hall effect region 11. Accordingly, at least one of the two p-n junctions between the substrate 10 and the first additional layer 451 and between the first layer 441 and the first vertical Hall effect region 11 is reversed-biased and therefore substantially non-conducting.

The vertical Hall sensor also comprises a first electrical connection 435 between the first layer 441 and a first circuit node 402c of a power supply-related series connection of the first and second vertical Hall effect regions 11, 12. The first circuit node 402c is electrically situated between the first and second vertical Hall effect regions. The vertical Hall sensor of the embodiment schematically illustrated in FIG. 4 further comprises a second electrical connection 436 between the second layer 442 and a second circuit node 403c of the power supply-related series connection. The second circuit node 403c is electrically situated between the second vertical Hall effect region 12 and a low supply potential (e.g. ground potential). Further electrical connections 437 and 438 are provided to electrically connect the third layer 443 with a third circuit node 404c and the fourth layer 444 with the ground potential.

The first, second, and third additional layers 451, 452, and 453 are also electrically connected to the first, second and third circuit nodes 402c, 403c, and 404c, respectively, using the first electrical connection 435, the second electrical connection 436, and the third electrical connection 437, respectively. The fourth additional layer 454 is connected to the ground potential using the fourth electrical connection 438.

In other words, FIG. 4 shows the stacked or series-connected vertical Hall regions 11 to 14 in one spinning phase and additional different supply current directions in each vertical Hall effect region (i.e. "outwards" in vertical Hall effect region 11, "from-left-to-right" in vertical Hall effect region 12, "from-right-to-left" in vertical Hall effect region 14, and "inwards" in vertical Hall effect region 14). The modulating back-bias effect from the substrate 10 is reduced by a factor of four by using isolated p-wells 441, 442, 443, 444 which are connected to the lowest potential of each stack (at the first, second, and third circuit nodes 402c, 403c, and 404c, and at the ground potential for the fourth vertical Hall effect region 14). The nearly quadratic dependency of residual offset from back-bias voltage leads to up to sixteen times smaller residual offset, compared to vertical Hall sensors comprising a single vertical Hall effect region that is exposed to the entire supply voltage.

The switch elements or switch arrangements 402, 403, 404 between the first, second, third and fourth pluralities of contacts each comprise two switch elements: the switch arrangement 402 comprises the switch elements 402a, 402b; the switch arrangement 403 comprises the switch elements 403a and 403b; and the switch arrangement 404 comprises the switch elements 404a and 404b. The switch arrangement 402 is now described in a representative manner for the two other switch arrangements 403 and 404. The switch element 402a is typically connected to at least two contacts of the first plurality of contacts (for the sake of clarity, only the currently active connection is shown in FIG. 4). The switch element 402 a may be an n-throw switch or a selector switch, as described above. At a second side the switch element 402a is connected to the first circuit node 402c. The second switch element 402b is also connected to the first circuit node 402c. At another side the second switch element 402b is connected to at least two contacts of the second plurality of contacts. In this manner it is assured that the first circuit node 402c is always at an electrical potential that is lower than (or at most equal to) the electrical potential(s) within the first vertical Hall effect region 11 and greater than or at least equal to the electrical potential(s) within the second vertical Hall effect region 12. The second circuit node 403c is located between the switch elements 403a, 403b of the switch arrangement 403. A third circuit node 404c is electrically situated between the switch elements 404a and 404b of the switch arrangement 404.

The switch elements 402a may be a first n-throw switch element connected on an n-throw side to at least two contacts of the first plurality of contacts and on a common terminal side to the first circuit code 402c. The switch element 402b may be a second n-throw switch element connected on a common terminal side to the first circuit node 402c and on an n-throw side to at least two contacts of the second plurality of contacts.

FIG. 5 shows a schematic block diagram of a vertical Hall sensor according to at least some embodiments. The vertical Hall sensor comprises four series connections 500a, 500b, 500c, and 500d. The four series connections 500a-500d are connected in parallel on a supply side (input side) and also connected in parallel on a sense side (output side).

The series connection 500a is substantially identical to the vertical Hall sensor that is illustrated in FIG. 4. However, the current source that powers the series connection 500a provides only Ibias/4, i.e. a quarter of the entire supply current Ibias. According to alternative embodiments, a common current source may be provided which powers all four series connections 500a-500d. The output terminals 391 and 392 of the series connection 500a are connected in parallel with corresponding output terminals of the other three series connections 500b, 500c, and 500d to form a pair of overall output terminals 591 and 592. An overall output signal of the entire vertical Hall sensor is provided at the pair of overall output signals 591, 592.

The four vertical Hall regions 11 to 14 of the first series connection or stack 500a are connected to the power supply and the differential amplifiers 381 to 384 in such a manner that each of the vertical Hall regions 11 to 14 is in a different clock phase of a four-phase spinning current scheme (for example, for the clock phase illustrated in FIG. 5: "outwards" for the first vertical Hall effect region 11, "right" for the second vertical Hall effect region 12, "left" for the third vertical Hall effect region 13, and "inwards" for the fourth vertical Hall effect region 14). This pattern is repeated for the three other series connections or stacks 500b, 500c, and 500d, however, with a shift of one clock phase between a preceding series connection and a succeeding series connection. Thus, in the second series connection or stack 500b the current direction in the first vertical Hall effect region is "right". The following Table 1 shows the current directions of all sixteen vertical Hall effect regions:

TABLE 1

| | series connection (stack) | | | |
|---|---|---|---|---|
| | 500a | 500b | 500c | 500d |
| $1^{st}$ Hall effect region 11 | outward | right | Left | inwards |
| $2^{nd}$ Hall effect region 12 | right | left | Inwards | outwards |
| $3^{rd}$ Hall effect region 13 | left | inwards | Outward | right |
| $4^{th}$ Hall effect region 14 | inwards | outward | Right | left |

The following Table 2 shows as a possible example the current directions of all sixteen Hall effect regions during a second clock phase of the spinning current scheme:

TABLE 2

| | series connection (stack) | | | |
|---|---|---|---|---|
| | 500a | 500b | 500c | 500d |
| $1^{st}$ Hall effect region 11 | right | left | Inwards | outwards |
| $2^{nd}$ Hall effect region 12 | left | inwards | Outwards | right |
| $3^{rd}$ Hall effect region 13 | inwards | outward | Right | left |
| $4^{th}$ Hall effect region 14 | outward | right | Left | inwards |

Figure 6A:
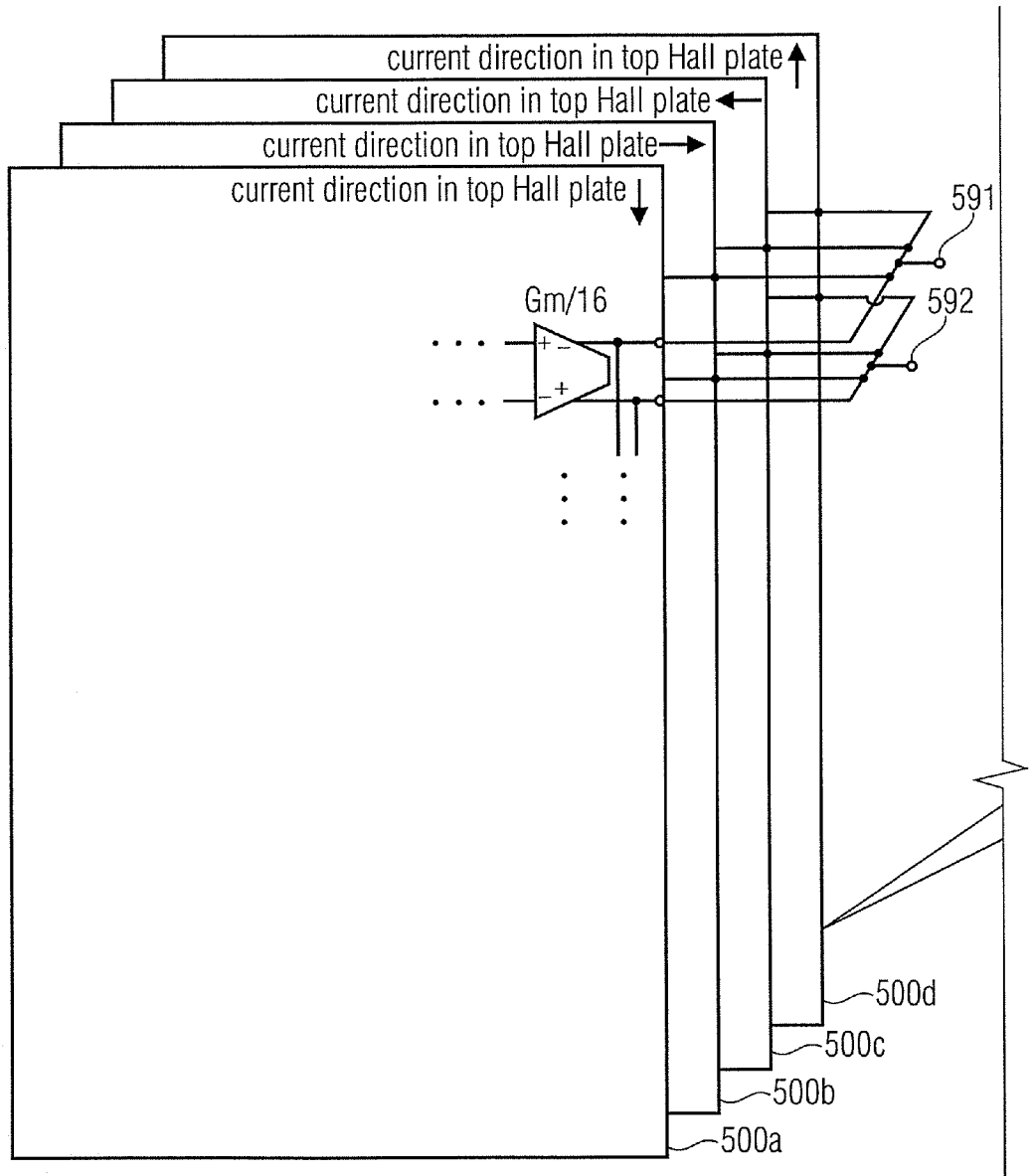
FIG. 6 schematically illustrates a comparison of performances of a vertical Hall sensor according to the embodiment of FIG. 5 with a vertical Hall sensor comprising a single vertical Hall effect region.

FIG. 6 schematically illustrates a comparison of the vertical Hall sensor according to the embodiment shown in FIG. 5 and a vertical Hall sensor comprising a single vertical Hall effect region. The vertical Hall sensor comprising a single vertical Hall region 611 is shown in the lower right part of FIG. 6. The vertical Hall effect region 611 is electrically insulated against the substrate 610 by an insulating arrangement 631 which comprises an isolated p-well 641 and a deep n-well 651. Electrical power is supplied to the single Hall effect region 611 by a current source Ibias and controlled using two switches 601 and 605 (for the sake of clarity, only the active connections during a first clock phase of a spinning current scheme are shown in FIG. 6). The vertical Hall sensor with the single Hall effect region 611 comprises a plurality of contacts 621, 622-1, 622-2, 623, and 624. A switch arrangement 671 controls which two of the plurality of contacts are used during the various clock phases of the spinning current scheme as sense contacts and selectively connects these currently selected sense contacts with an input of a differential amplifier 681. An output signal of the vertical Hall sensor can then be obtained at an output of the differential amplifier 681 which is connected to a pair of output terminals 691 and 692.

A comparison of the electrical and performance characteristics of the vertical Hall sensor comprising 4×4=16 vertical Hall effect regions and the vertical Hall sensor comprising a single vertical Hall effect region shows that the supply current Ibias and the input resistance Rbias are substantially equal for both vertical Hall sensors. The output resistance Rsense is approximately sixteen times smaller for the 4×4 vertical Hall effect regions arrangement on the left. The transconductance Gm is equal for both vertical Hall sensors. Both the signal and the noise are approximately four times smaller for the 4×4 vertical Hall effect regions arrangement on the left than for the single Hall effect region arrangement on the right. Consequently, the signal-to-noise ratio S/N is approximately equal for both the 4×4 vertical Hall sensor on the left and the single Hall effect region sensor on the right. When studying the back-bias voltage Vbackbias, it can be seen that every single vertical Hall effect region of the 4×4 vertical Hall effect regions arrangement experiences only approximately a quarter of the back-bias voltage Vbackbias/4 that can be observed for the single vertical Hall effect region 611. Due to the quadratic dependency of the back-bias effect on the back-bias voltage, the back-bias effect is strongly reduced (approximately by a factor 16) for the 4×4 arrangement on the left of FIG. 6, compared to the full back-bias effect which occurs in the single vertical Hall effect region arrangement on the right side of FIG. 6. Accordingly, the stacked residual offset is significantly smaller than the unstacked or non-isolated back-bias effect.

FIG. 6 demonstrates that stacked vertical Hall effect regions with isolating p-wells and parallel switch Hall effect region stacks with different current directions may lead to equivalent signal-to-noise ratio (S/N or SNR), but much smaller residual offset.

Figure 7:
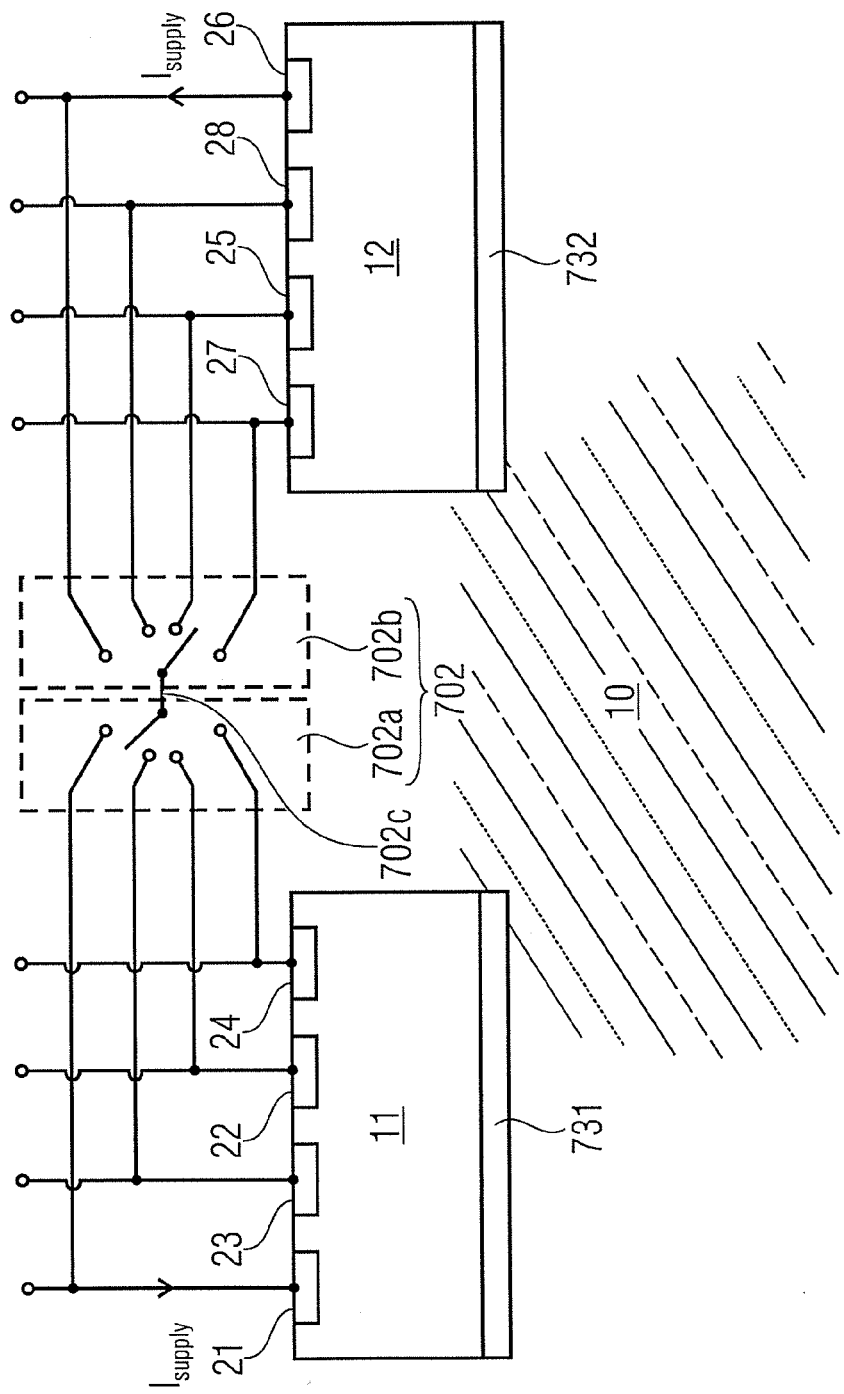
FIG. 7 shows a schematic block diagram of a vertical Hall sensor comprising two n-throw switch elements according to further embodiments.

FIG. 7 shows a schematic block diagram of two series-connected vertical Hall effect regions 11, 12 and a switch arrangement 702 for interconnecting the first plurality of contacts 21 to 24 and the second plurality of contacts 25 to 28. A first layer or insulating arrangement 731 electrically insulates the first vertical Hall effect region 11 from the semiconductor substrate 10. A second layer or insulating arrangement 732 electrically insulates the second vertical Hall effect region 12 from the semiconductor substrate 10.

The switch arrangement 702 comprises a first n-throw switch element 702a and a second n-throw switch element 702b. In the embodiment schematically illustrated in FIG. 7 the two n-throw switch elements 702a and 702b are implemented as four-throw switch elements. The first n-throw switch element 702a comprises a common terminal and the second n-throw switch element 702b also comprises a common terminal. The common terminals of both n-throw switch elements 702a, 702b are connected together to form a first circuit node 702c. The switch arrangement 702 makes it possible to connect one of the contacts of the first plurality of contacts 21 to 24 with one contact of the second plurality of contacts 25 to 28 in order to establish the series connection between the first and second vertical Hall effect regions 11 and 12. As an example the supply current or supply current Ibias is provided to the contact 21 of the first plurality of contacts. The first n-throw switch element 702a may now be controlled to connect the contact 22 to the first circuit node 702a so that the supply current Ibias flows within the first vertical Hall effect region 11 from the contact 21 to the contact 22. The second n-throw switch element 702b may be controlled to connect the first circuit node 702c with the contact 25. The supply current may now, for example, flow from the contact 25 within the second vertical Hall effect region 12 to the contact 26 where it leaves the second vertical Hall effect region 12.

Figure 8:
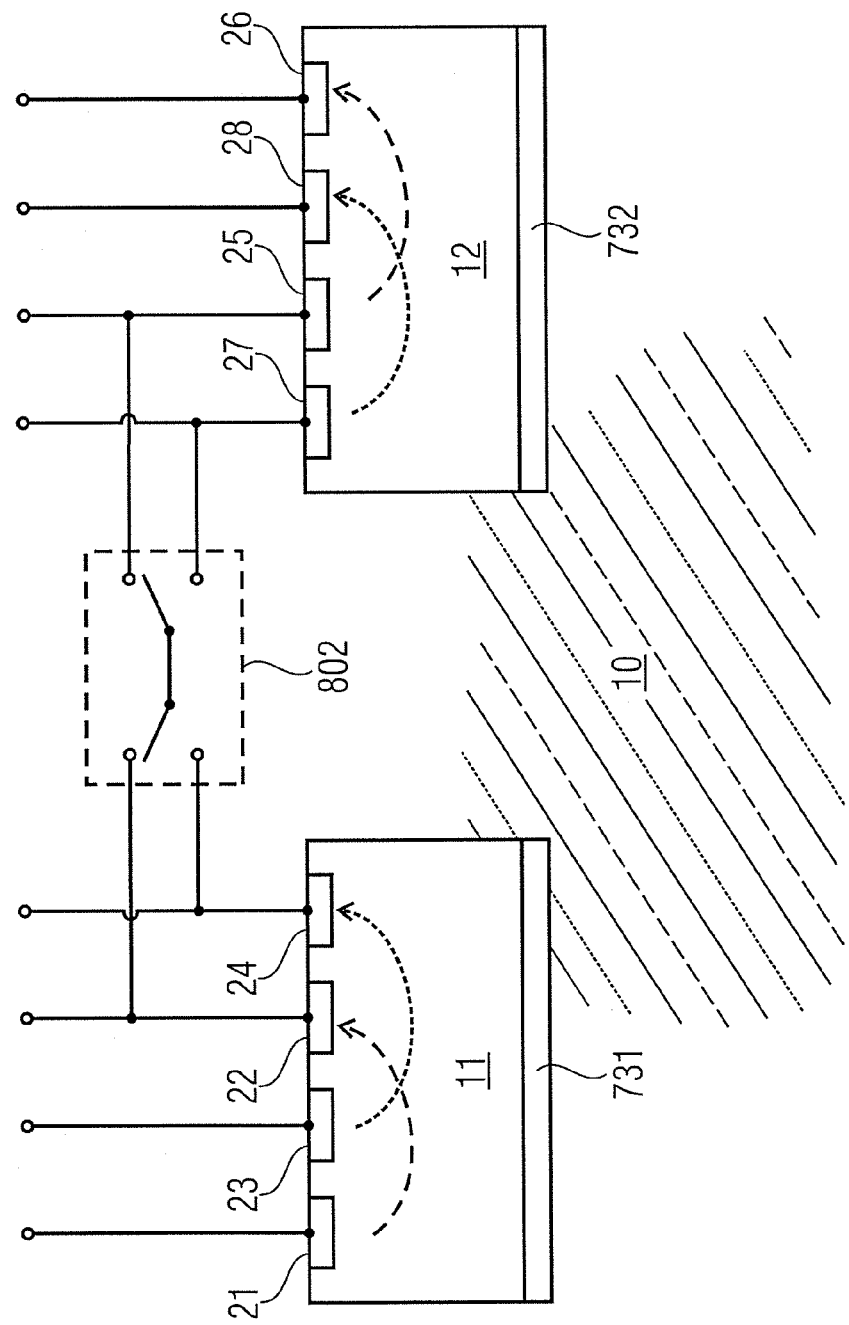
FIG. 8 shows a schematic block diagram of a vertical Hall sensor comprising a switch element according to further embodiments.

FIG. 8 shows a schematic block diagram of two series connected vertical Hall effect regions 11 and 12. The vertical Hall sensor further comprises a switch element 802 which selectively interconnects at least two first contacts 22 and 24 of the first plurality of contacts and at least second contacts 27 and 25 of the second plurality of contacts. The switch element 802 is configured to interconnect the at least two first contacts 22, 24 and the at least two second contacts 27, 25 in different configurations. According to a first possible configuration (schematically illustrated in FIG. 8 by dashed arrows) the supply current Ibias is provided to the contact 21 and flows through the first vertical Hall effect region 11 to the contact 22. The switch element 802 may now connect the contacts 22 and 25 so that the supply current Ibias flows via the contact 25 through the second vertical Hall effect region 12 to the contact 26. According to another possible configuration schematically illustrated in FIG. 8 by dotted arrows, the supply current Ibias is provided to the contact 23, flows through the first vertical Hall effect region 11 to the contact 24. The switch element 802 may be controlled to connect the contact 24 with the contact 27, so that the supply current Ibias enters the second vertical Hall effect region 12 via the contact 27. The supply current Ibias flows through the second vertical Hall effect region 12 to the contact 28 where it leaves the second vertical Hall effect region 12. These two possible configurations are examples only and other configurations are, of course, possible.

Figure 9:
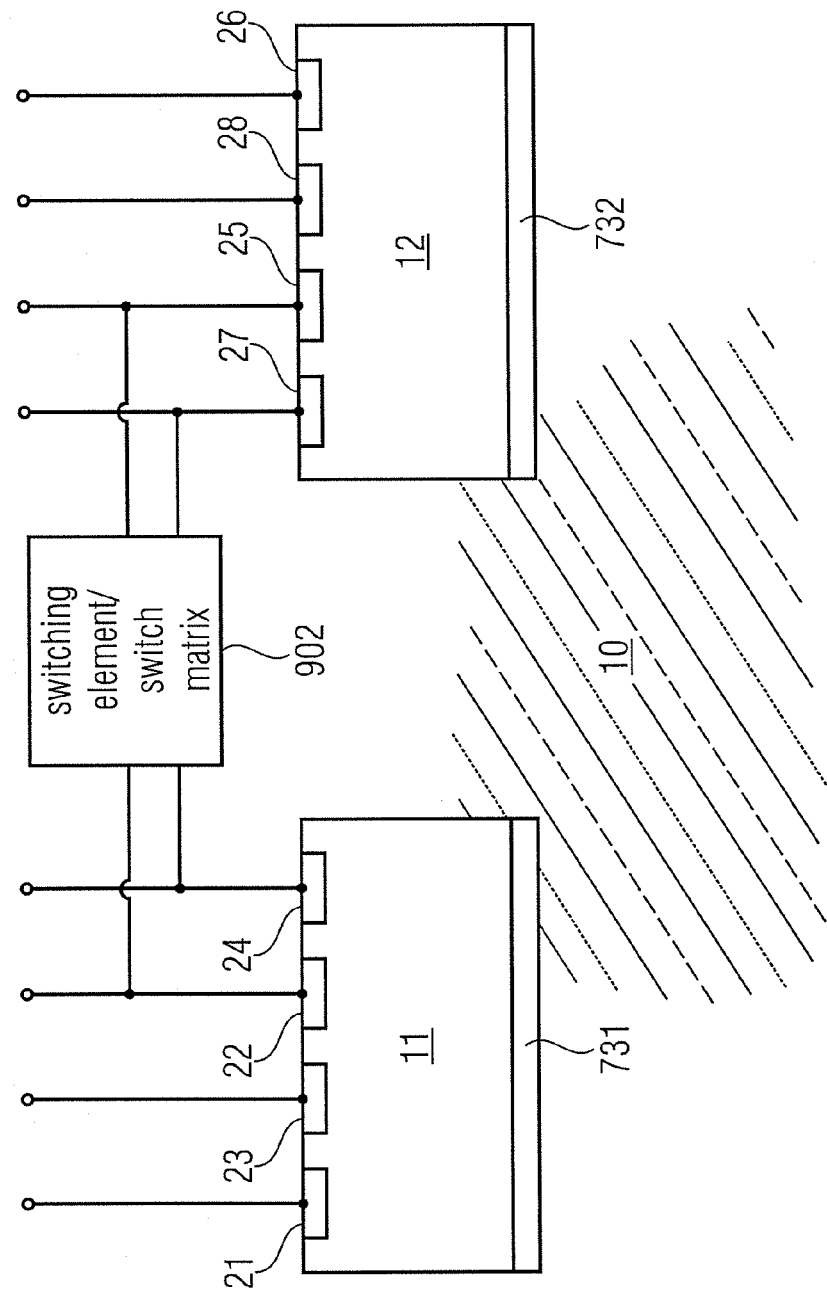
FIG. 9 shows a schematic block diagram of a vertical Hall sensor comprising a switch element or switch matrix according to further embodiments.

FIG. 9 shows a schematic block diagram of a vertical Hall sensor according to further possible embodiments. The embodiment of FIG. 9 is similar to the embodiment of FIG. 8 except that the switch arrangement 802 is replaced by a switch matrix 902 which connects two contacts 22, 24 of the first plurality of contacts 21, 24 with two contacts 25 and 27 of the second plurality of contacts 25 to 28. The switch matrix 902 may provide some additional functionality over the switch element 802, for example a concurrent connection of contact 22 with contact 27 and of contact 24 with contact 25 (in which case, however, the first and second vertical Hall effect regions 11, 12 would not be connected in series, strictly speaking, but rather form a bridge arrangement).

Figure 10:
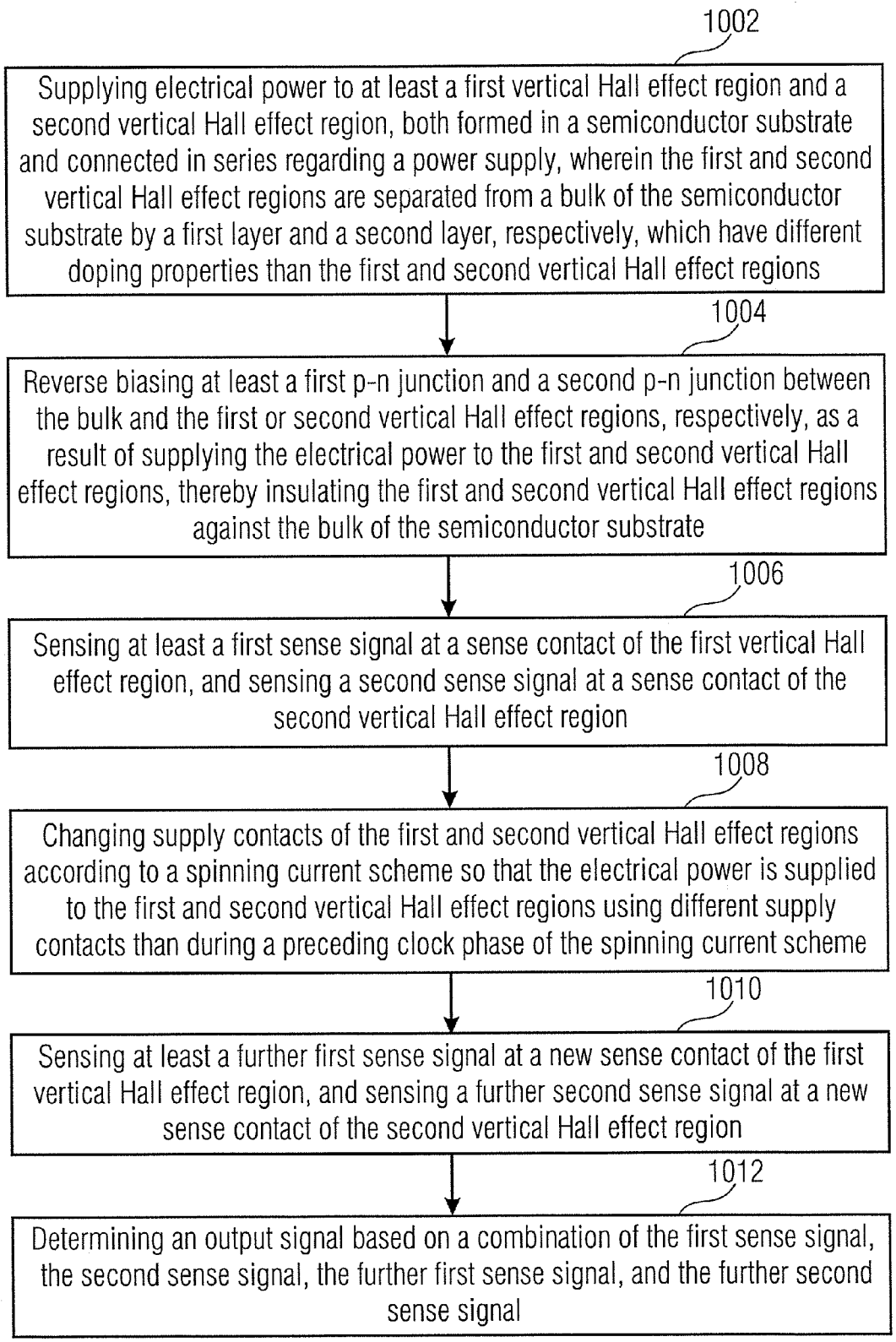
FIG. 10 shows a schematic flow diagram of a method for operating a vertical Hall sensor according to embodiments.

FIG. 10 shows a schematic flow diagram of a method for operating a vertical Hall sensor according to embodiments. The method comprises a step 1002 of supplying electrical power to at least a first vertical Hall effect region and a second vertical Hall effect region. Both vertical Hall effect regions are formed in a semiconductor substrate and connected in series regarding a power supply. The first and second vertical Hall effect regions are separated from a bulk of the semiconductor substrate by a first layer and a second layer, respectively, which have different doping properties than the first and second vertical Hall effect regions. The step 1002 of supplying electrical power to at least the first and second vertical Hall effect regions causes (provided the electrical power has the correct polarity) at least a first p-n junction and a second p-n junction to become reverse-biased, as indicated at step 1004. The first p-n junction is arranged between the first vertical Hall effect region and the bulk of the semiconductor substrate. The second p-n junction is arranged between the second vertical Hall effect region and the bulk of the semiconductor substrate. As mentioned, the reverse bias of the first and second p-n junctions is a result of supplying the electrical power to the first and second vertical Hall effect regions. The reverse-biased p-n junctions electrically insulate the first and second vertical Hall effect regions against or from the bulk of the semiconductor substrate.

At a step 1006 at least a first sense signal is sensed at a sense contact of the first vertical Hall effect region. A second sense signal is sensed at a sense contact of the second vertical Hall effect region.

Then the supply contacts of the first and second vertical Hall effect regions are changed according to a spinning current scheme, as indicated at step 1008. Accordingly, the electrical power is supplied to the first and second vertical Hall effect regions using different supply contacts than during a preceding clock phase of the spinning current scheme.

The method of operating a vertical Hall sensor continues with step 1010 which comprises sensing at least a further first sense signal at a new sense contact of the first vertical Hall effect region. Step 1010 also comprises sensing a further second sense signal at a new sense contact of the second vertical Hall effect region.

An output signal is then determined, at step 1012, based on a combination of the first sense signal, the second sense signal, the further first sense signal, and the further second sense signal.

According to embodiments, the electrical power may be supplied to the first and second vertical Hall effect regions so that resulting current flows within the first and second vertical Hall effect regions have opposite directions.

In alternative embodiments of the method for operating it is possible that the step of sensing the at least one first and second sense signals comprises at least one of: parallel switching of the sense contacts or the new sense contacts of the first and second vertical Hall effect regions; and 90° switching of the sense contacts or the new sense contacts of the first and second vertical Hall effect regions.

According to further possible embodiments the spinning current scheme may comprise at least three clock phases and the method may further comprise inversing a spinning direction in which the at least three clock phases succeed each other. This will be further explained below in the context of FIG. 12.

The vertical Hall sensor may comprise a further series connection of at least two vertical Hall effect regions which has a similar or identical configuration as the series connection of the first and second vertical Hall regions. The spinning current scheme may comprise at least three clock phases, and the spinning orders in which the at least three clock phases succeed each other may be opposite or different for the further series connection and the series connection of the first and second Hall effect regions. For example, a four-phase spinning current scheme may have the clock phases A, B, C, and D. A first stack or series connection of at least two vertical Hall effect regions may be operated according to the order ABCD. Another stack or series connection may be operated according to the order DCBA, i.e. in the opposite spinning direction. Yet another stack or series connection could be operated according to the sequence ACBD.

Different spinning directions may also be applied to the individual vertical Hall effect regions that are part of a stack or series connection. In particular, the spinning current scheme may comprise at least three clock phases and the spinning orders in which the at least three clock phases succeed each other may be opposite or different for the first vertical Hall effect region 11 and the second vertical Hall effect region 12.

FIG. 11 shows a schematic flow diagram of a method for operating a vertical Hall sensor according to some further embodiments. The method comprises a step 1102 of supplying electrical power to a vertical Hall sensor. The Hall sensor comprises a pair of supply terminals connectable to a power supply, a series connection of at least two vertical Hall effect regions interconnecting the pair of supply terminals, and at least two insulation arrangements between the at least two vertical Hall effect regions and the semiconductors substrate, respectively. By supplying electrical power to the vertical Hall sensor, the at least two vertical Hall effect regions are electrically insulated against the semiconductor substrate, due to reverse-biasing at least two p-n junctions of which at least one portion is located within the at least two insulation arrangements.

The electrical power may be supplied to the first and second vertical Hall effect regions so that the resulting current flows within the first and second vertical Hall effect regions have opposite directions.

According to further embodiments, the method may further comprise: sensing at least one first sense signal and one second sense signal at sense contacts of the first and second vertical Hall effect regions. Sensing may comprise at least one of: parallel switching of the sense contacts or the new sense contacts of the first and second vertical Hall effect regions; and 90° switching of the sense contacts or the new sense contacts of the first and second vertical Hall effect regions.

The method may also comprise the determination of a signal sum, of a signal difference, and/or a signal average using a summing amplifier, a difference amplifier, and/or an averaging amplifier. Averaging can also be performed by individual analog-to-digital converters for each of the individual sense signals and combining the digital conversion result in a digital manner.

According to further embodiments the method may further comprise changing supply contacts of the first and second vertical Hall effect regions according to a spinning current scheme so that electrical power is supplied to the first and second vertical Hall effect regions using different supply contacts than during a preceding clock phase of the spinning current scheme. The spinning current scheme may comprise at least three clock phases. The method may further comprise inversing a spinning direction in which the at least three clock phases succeed each other. Inversing the spinning direction may occur periodically with a frequency that is lower than a frequency of the clock phase changes. For example, the spinning direction may be inversed every time a complete spinning current cycle is complete, or every n spinning current cycles.

The vertical Hall sensor may comprise a further series connection of at least two vertical Hall effect regions, which has a similar or identical configuration as the series connection of the first and second vertical Hall regions. The spinning current scheme may comprise at least three clock phases. Spinning orders in which the at least three clock phases succeed each other may be opposite, inversed, or different for the further series connection and the series connection of the at least two vertical Hall effect regions.

The electrical power may be supplied to the at least two vertical Hall effect regions according to a spinning current scheme which comprises at least three clock phases. Spinning orders in which the at least three clock phases succeed each other may be opposite, inversed, or different for each one of the at least two vertical Hall effect regions or for subsets of the at least two vertical Hall effect regions.

FIG. 12 schematically illustrates a spinning current scheme comprising three clock phases. The spinning current scheme is applied to a vertical Hall region 1211 which comprises a plurality of three contacts 1221, 1222, and 1223. During a clock phase 1 a supply current $I_{supply}$ is provided to the contact 1221 and leaves the vertical Hall effect region 1211 at the contact 1222. A sense signal $V_{sense}$ is determined between the contact 1223 and the ground contact 1222. The spinning current scheme comprises two further clock phases, namely clock phase 2 and clock phase 3, in which the functions of the contacts 1221, 1222, and 1223 are at least partially changed. By determining a weighted sum of the sense signals $V_{sense}$ obtained during the three different clock phases, an overall sense signal can be determined which typically is indicative of a magnetic field component which is orthogonal to the drawing plane.

The clock phases may succeed each other in a clockwise direction 1207 or a counterclockwise direction 1208 (the expressions "clockwise" and "counterclockwise" refer to the graphical illustration of FIG. 12 only, and shall not be construed as limiting). In particular if the vertical Hall sensor comprises several stacks or series connections of vertical Hall effect regions, half of the stacks (series connections) may follow a spinning current scheme with the spinning direction 1207 and the other half may be operated according to a spinning current scheme with the spinning direction 1208. Different spinning directions 1207 and 1208 may also be applied to the individual vertical Hall effect regions within one stack (series connection).

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

In the foregoing Detailed Description, it can be seen that various features are grouped together in embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Furthermore, in some embodiments a single step may include or may be broken into multiple sub steps. Such sub steps may be included and part of the disclosure of this single step unless explicitly excluded.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A vertical Hall sensor comprising:
a first vertical Hall effect region formed in a semiconductor substrate, with a first plurality of contacts arranged at one side of the first vertical Hall effect region;
a second vertical Hall effect region formed in the semiconductor substrate and of a same doping type as the first vertical Hall effect region, with a second plurality of contacts arranged at one side of the second vertical Hall effect region, wherein the second vertical Hall effect region is connected in series with the first vertical Hall effect region regarding a power supply to the first and second vertical Hall effect regions;
a first layer adjacent to the first vertical Hall effect region at a side other than a side of the first plurality of contacts, having different doping properties than the first vertical Hall effect region, and insulating the first vertical Hall effect region from a bulk of the semiconductor substrate by at least one reverse-biased p-n junction during an operation of the vertical Hall sensor;
a second layer adjacent to the second vertical Hall effect region at a side other than a side of the second plurality of contacts, having different doping properties than the second vertical Hall effect region, and insulating the second vertical Hall effect region from a bulk of the semiconductor substrate by at least one reverse-biased p-n junction during an operation of the vertical Hall sensor; and
a switch element interconnected between at least two first contacts of the first plurality of contacts and at least two second contacts of the second plurality of contacts configured to interconnect the at least two first contacts and the at least two second contacts in different configurations based on a state of the switch element.

2. The vertical Hall sensor according to claim 1, wherein the first layer and the second layer have a higher doping level than the first vertical Hall effect region and the second vertical Hall effect region, respectively.

3. The vertical Hall sensor according to claim 2, wherein the first layer is adjacent to a bulk of the semiconductor substrate at a side opposite to the first vertical Hall effect region and wherein the second layer is adjacent to the bulk of the semiconductor substrate at a side opposite to the second vertical Hall effect region.

4. The vertical Hall sensor according to claim 2, wherein the first layer and the second layer are at least one of: an n-buried layer, two separate portions of an n-buried layer, a p-buried layer, and two separate portions of a p-buried layer.

5. The vertical Hall sensor according to claim 1, further comprising a deep trench isolation that extends to a depth into the semiconductor substrate at which the first and second layers are located, in order to electrically isolate the first vertical Hall effect region and the first layer from the second vertical Hall effect region and the second layer.

6. The vertical Hall sensor according to claim 1, wherein the first layer and the second layer have a different doping type than the first vertical Hall effect region and the second vertical Hall effect region, and wherein the vertical Hall sensor further comprises:

a first additional layer between the first layer and the bulk of the semiconductor substrate for electrically insulating the first layer from the bulk of the semiconductor substrate;

a second additional layer between the second layer and the bulk of the semiconductor substrate for electrically insulating the second layer from the bulk of the semiconductor substrate;

a first electrical connection between the first layer and a first circuit node of a power supply-related series connection of the first and second vertical Hall effect regions, the first circuit node being electrically situated between the first and second vertical Hall effect regions; and a second electrical connection between the second layer and a second circuit node of the power supply-related series connection, the second circuit node being electrically situated between the second vertical Hall effect region and a low supply potential.

7. The vertical Hall sensor according to claim 6, wherein the first additional layer is electrically connected to the first circuit node and the second additional layer is electrically connected to the second circuit node.

8. The vertical Hall sensor according to claim 6, further comprising:
a first n-throw switch element connected on an n-throw side to the at least two contacts of the first plurality of contacts and on a common terminal side to the first circuit node; and
a second n-throw switch element connected on the common terminal side to the first circuit node and on an n-throw side to the at least two contacts of the second plurality of contacts.

9. The vertical Hall sensor according to claim 1, further comprising a third vertical Hall effect region with a third plurality of contacts and a fourth vertical Hall effect region with a fourth plurality of contacts, the third and fourth vertical Hall effect regions being connected in series with the first and second vertical Hall effect regions regarding the power supply to the first and second Hall effect regions.

10. The vertical Hall sensor according to claim 9, wherein contacts of the first, second, third, and fourth pluralities of contacts are interconnected with each other so that each of the first, second, third, and fourth Hall effect regions is operated in a different clock phase of a four-phase spinning current scheme.

11. The vertical Hall sensor according to claim 1, wherein the first and second vertical Hall effect regions form a first series connection, and wherein the vertical Hall sensor further comprises a second series connection of at least two vertical Hall effect regions.

12. The vertical Hall sensor according to claim 11, wherein the first and second series connections are connected in parallel to a pair of power supply terminals.

13. The vertical Hall sensor according to claim 11, wherein the vertical Hall effect regions of the first series connection and the second series connection are operated according to a spinning current scheme having at least three clock phases, and wherein a spinning direction for the vertical Hall effect regions of the first series connection is opposite to a spinning direction for the vertical Hall effect regions of the second series connection.

14. The vertical Hall sensor according to claim 13, wherein the spinning direction for the vertical Hall effect regions of the first and second series connections is changed with a spinning direction frequency that is less than or equal to half a spinning scheme frequency of the spinning current scheme.

15. The vertical Hall sensor according to claim 1, wherein the first vertical Hall effect region is operated according to a spinning current scheme with a first spinning direction and the second vertical Hall effect region is operated according to a spinning current scheme with a second spinning direction.

16. A vertical Hall sensor comprising:
a first vertical Hall effect region formed in a semiconductor substrate, with a first plurality of contacts arranged at one side of the first vertical Hall effect region;
a second vertical Hall effect region formed in the semiconductor substrate and of a same doping type as the first vertical Hall effect region, with a second plurality of contacts arranged at one side of the second vertical Hall effect region, wherein the second vertical Hall effect region is connected in series with the first vertical Hall effect region regarding a power supply to the first and second vertical Hall effect regions;
a first layer adjacent to the first vertical Hall effect region at a side other than a side of the first plurality of contacts, having different doping properties than the first vertical Hall effect region, and insulating the first vertical Hall effect region from a bulk of the semiconductor substrate by at least one reverse-biased p-n junction during an operation of the vertical Hall sensor;
a second layer adjacent to the second vertical Hall effect region at a side other than a side of the second plurality of contacts, having different doping properties than the second vertical Hall effect region, and insulating the second vertical Hall effect region from a bulk of the semiconductor substrate by at least one reverse-biased p-n junction during an operation of the vertical Hall sensor; and
a switch matrix interconnected between the first plurality of contacts and the second plurality of contacts and configured to provide a plurality of different interconnection configurations between the contacts of the first and second plurality of contacts based on a state of the switch matrix.

17. A vertical Hall sensor comprising:
a first vertical Hall effect region formed in a semiconductor substrate, with a first plurality of contacts arranged at one side of the first vertical Hall effect region;
a second vertical Hall effect region formed in the semiconductor substrate and of a same doping type as the first vertical Hall effect region, with a second plurality of contacts arranged at one side of the second vertical Hall effect region, wherein the second vertical Hall effect region is connected in series with the first vertical Hall effect region regarding a power supply to the first and second vertical Hall effect regions;
a first layer adjacent to the first vertical Hall effect region at a side other than a side of the first plurality of contacts, having different doping properties than the first vertical Hall effect region, and insulating the first vertical Hall effect region from a bulk of the semiconductor substrate by at least one reverse-biased p-n junction during an operation of the vertical Hall sensor;
a second layer adjacent to the second vertical Hall effect region at a side other than a side of the second plurality of contacts, having different doping properties than the second vertical Hall effect region, and insulating the second vertical Hall effect region from a bulk of the semiconductor substrate by at least one reverse-biased p-n junction during an operation of the vertical Hall sensor; and
a difference summing amplifier configured to sum a first potential difference between two first sense contacts of the first plurality of contacts and a second potential difference between two second sense contacts of the second plurality of contacts.

18. A vertical Hall sensor comprising:
- a first vertical Hall effect region formed in a semiconductor substrate, with a first plurality of contacts arranged at one side of the first vertical Hall effect region;
- a second vertical Hall effect region formed in the semiconductor substrate and of a same doping type as the first vertical Hall effect region, with a second plurality of contacts arranged at one side of the second vertical Hall effect region, wherein the second vertical Hall effect region is connected in series with the first vertical Hall effect region regarding a power supply to the first and second vertical Hall effect regions;
- a first layer adjacent to the first vertical Hall effect region at a side other than a side of the first plurality of contacts, having different doping properties than the first vertical Hall effect region, and insulating the first vertical Hall effect region from a bulk of the semiconductor substrate by at least one reverse-biased p-n junction during an operation of the vertical Hall sensor;
- a second layer adjacent to the second vertical Hall effect region at a side other than a side of the second plurality of contacts, having different doping properties than the second vertical Hall effect region, and insulating the second vertical Hall effect region from a bulk of the semiconductor substrate by at least one reverse-biased p-n junction during an operation of the vertical Hall sensor; and
- a first differential amplifier connected on an input side to sense contacts of the first plurality of contacts and a second differential amplifier connected on an input side to sense contacts of the second plurality of contacts, wherein respective outputs of the first and second differential amplifiers are combined to provide an output signal of the vertical Hall sensor.

19. A vertical Hall sensor comprising:
- a first vertical Hall effect region formed in a semiconductor substrate, with a first plurality of contacts arranged at one side of the first vertical Hall effect region;
- a second vertical Hall effect region formed in the semiconductor substrate and of a same doping type as the first vertical Hall effect region, with a second plurality of contacts arranged at one side of the second vertical Hall effect region, wherein the second vertical Hall effect region is connected in series with the first vertical Hall effect region regarding a power supply to the first and second vertical Hall effect regions;
- a first layer adjacent to the first vertical Hall effect region at a side other than a side of the first plurality of contacts, having different doping properties than the first vertical Hall effect region, and insulating the first vertical Hall effect region from a bulk of the semiconductor substrate by at least one reverse-biased p-n junction during an operation of the vertical Hall sensor;
- a second layer adjacent to the second vertical Hall effect region at a side other than a side of the second plurality of contacts, having different doping properties than the second vertical Hall effect region, and insulating the second vertical Hall effect region from a bulk of the semiconductor substrate by at least one reverse-biased p-n junction during an operation of the vertical Hall sensor; and
- a power supply switch arrangement configured to selectively connect the first plurality of contacts or the second plurality of contacts with a high supply potential and the respective other plurality of contacts with a low supply potential so that an order of the first and second vertical Hall effect regions within the series connection is reversed.

* * * * *